United States Patent
Honda

(10) Patent No.: US 8,713,492 B2
(45) Date of Patent: Apr. 29, 2014

(54) DATA PROCESSING APPARATUS INCLUDING RECONFIGURABLE LOGIC CIRCUIT

(75) Inventor: Hiroki Honda, Tokyo (JP)

(73) Assignee: Fuji Xerox Co., Ltd., Tokyo (JP)

( * ) Notice: Subject to any disclaimer, the term of this patent is extended or adjusted under 35 U.S.C. 154(b) by 753 days.

(21) Appl. No.: 12/831,360

(22) Filed: Jul. 7, 2010

(65) Prior Publication Data

US 2011/0004744 A1 Jan. 6, 2011

Related U.S. Application Data

(62) Division of application No. 11/718,195, filed as application No. PCT/JP2005/019924 on Oct. 28, 2005, now Pat. No. 7,779,380.

(30) Foreign Application Priority Data

Oct. 28, 2004 (JP) .................................. 2004-313710

(51) Int. Cl.
*G06F 17/50* (2006.01)

(52) U.S. Cl.
USPC ........... 716/101; 716/100; 716/102; 716/104; 716/105; 716/106; 716/117; 703/14; 703/15

(58) Field of Classification Search
USPC ......... 716/100, 101, 102, 104, 105, 106, 117; 703/14, 15
See application file for complete search history.

(56) References Cited

U.S. PATENT DOCUMENTS

| | | | |
|---|---|---|---|
| 6,034,538 A | 3/2000 | Abramovici | |
| 6,173,434 B1 | 1/2001 | Wirthlin et al. | |
| 6,321,366 B1 | 11/2001 | Tseng et al. | |
| 6,466,898 B1 * | 10/2002 | Chan ................................ | 703/17 |
| 6,629,296 B1 | 9/2003 | Ganesan et al. | |

(Continued)

FOREIGN PATENT DOCUMENTS

| | | |
|---|---|---|
| EP | 1 441 283 | 7/2004 |
| WO | WO-01/45258 A3 | 6/2001 |

OTHER PUBLICATIONS

Stadler et al.; "Functional verification of intellectual properties (IP): asimulation-based solution for an application-specific instruction-set processor"; Publication Year: 1999; Test Conference, 1999. Proceedings. International; pp. 414-420.*

(Continued)

*Primary Examiner* — Helen Rossoshek
(74) *Attorney, Agent, or Firm* — Marshall, Gerstein & Borun LLP; Randall G. Rueth

(57) ABSTRACT

There is provided a data processing apparatus (1) including a logic circuit (10) that is reconfigurable in each cycle and a library (2) that stores hardware control information (20). The hardware control information (20) includes a plurality of pieces of cycle-based mapping information (21) for individually mapping a plurality of cycle-based circuits, which each realize a function in each cycle for executing an application, onto the logic circuit (10) and configuration selection information (22) for selecting at least one of the plurality of pieces of cycle-based mapping information according to an execution state of the application. The data processing apparatus (1) includes a control unit (11) that reconfigures at least part of the logic region (10) using at least one of the plurality of pieces of cycle-based mapping information (21) according to a request in each cycle based on the configuration selection information (22).

5 Claims, 20 Drawing Sheets

(56) References Cited

U.S. PATENT DOCUMENTS

| | | |
|---|---|---|
| 6,691,287 B2 | 2/2004 | Ganesan et al. |
| 6,816,826 B1 | 11/2004 | Andersen et al. |
| 6,901,565 B2 * | 5/2005 | Sokolov .................. 716/109 |
| 6,944,834 B2 | 9/2005 | Posat et al. |
| 7,076,416 B2 | 7/2006 | Chen et al. |
| 7,200,735 B2 | 4/2007 | Wang et al. |
| 7,437,690 B2 | 10/2008 | Baumgartner et al. |
| 7,516,059 B2 | 4/2009 | Komatsu et al. |
| 7,996,827 B2 * | 8/2011 | Vorbach et al. ............. 717/149 |
| 2002/0133325 A1 | 9/2002 | Hoare et al. |
| 2004/0103265 A1 | 5/2004 | Smith |
| 2005/0038550 A1 | 2/2005 | Sato |
| 2005/0050482 A1 | 3/2005 | Keller et al. |
| 2005/0198596 A1 | 9/2005 | Oshins et al. |
| 2007/0219771 A1 * | 9/2007 | Verheyen et al. ............... 703/15 |
| 2008/0122482 A1 | 5/2008 | Sato |
| 2009/0031106 A1 | 1/2009 | Honda |
| 2009/0164773 A1 * | 6/2009 | Ishihara et al. ............... 713/100 |

OTHER PUBLICATIONS

Cronquist et al., "Architecture Design of Reconfigurable Pipelined Datapaths", *dv. Res. in VLSI, Proceedings, 20th Aniv. Conf.*, 23-40 (1999).

Villasenor, et al., "Video Communications Using Rapidly Reconfigurable Hardware", *IEEE*, 5:565-567 1995.

International Search Resort for PCT/JP2005/019924 dated Dec. 13, 2005.

Supplementary European Search Report for EP 05 80 5358.8 dated Jan. 7, 2008.

* cited by examiner

Fig. 7

| cfg-mod [2:0] | idat [3] | [2] | [1] | [0] | odat_g [1] | [0] | odat_r | Remarks |
|---|---|---|---|---|---|---|---|---|
| 000 (4in1out) | 0 | 0 | 0 | 0 | 0 | cfg_func [0] | cfg_func [0] | Store value of odat-g [0] |
| | 0 | 0 | 0 | 1 | 0 | cfg_func [1] | cfg_func [1] | |
| | 0 | 0 | 1 | 0 | 0 | cfg_func [2] | cfg_func [2] | |
| | 0 | 0 | 1 | 1 | 0 | cfg_func [3] | cfg_func [3] | |
| | 0 | 1 | 0 | 0 | 0 | cfg_func [4] | cfg_func [4] | |
| | 0 | 1 | 0 | 1 | 0 | cfg_func [5] | cfg_func [5] | |
| [mode #0] | 0 | 1 | 1 | 0 | 0 | cfg_func [6] | cfg_func [6] | |
| | 0 | 1 | 1 | 1 | 0 | cfg_func [7] | cfg_func [7] | |
| | 1 | 0 | 0 | 0 | 0 | cfg_func [8] | cfg_func [8] | |
| | 1 | 0 | 0 | 1 | 0 | cfg_func [9] | cfg_func [9] | |
| | 1 | 0 | 1 | 0 | 0 | cfg_func [10] | cfg_func [10] | |
| | 1 | 0 | 1 | 1 | 0 | cfg_func [11] | cfg_func [11] | |
| | 1 | 1 | 0 | 0 | 0 | cfg_func [12] | cfg_func [12] | |
| | 1 | 1 | 0 | 1 | 0 | cfg_func [13] | cfg_func [13] | |
| | 1 | 1 | 1 | 0 | 0 | cfg_func [14] | cfg_func [14] | |
| | 1 | 1 | 1 | 1 | 0 | cfg_func [15] | cfg_func [15] | |
| 001 (4in1out) | 0 | 0 | 0 | 0 | 0 | cfg_func [0] | lat_dat | Register separated |
| | 0 | 0 | 0 | 1 | 0 | cfg_func [1] | lat_dat | |
| | 0 | 0 | 1 | 0 | 0 | cfg_func [2] | lat_dat | |
| | 0 | 0 | 1 | 1 | 0 | cfg_func [3] | lat_dat | |
| | 0 | 1 | 0 | 0 | 0 | cfg_func [4] | lat_dat | |
| | 0 | 1 | 0 | 1 | 0 | cfg_func [5] | lat_dat | |
| | 0 | 1 | 1 | 0 | 0 | cfg_func [6] | lat_dat | |
| [mode #1] | 0 | 1 | 1 | 1 | 0 | cfg_func [7] | lat_dat | |
| | 1 | 0 | 0 | 0 | 0 | cfg_func [8] | lat_dat | |
| | 1 | 0 | 0 | 1 | 0 | cfg_func [9] | lat_dat | |
| | 1 | 0 | 1 | 0 | 0 | cfg_func [10] | lat_dat | |
| | 1 | 0 | 1 | 1 | 0 | cfg_func [11] | lat_dat | |
| | 1 | 1 | 0 | 0 | 0 | cfg_func [12] | lat_dat | |
| | 1 | 1 | 0 | 1 | 0 | cfg_func [13] | lat_dat | |
| | 1 | 1 | 1 | 0 | 0 | cfg_func [14] | lat_dat | |
| | 1 | 1 | 1 | 1 | 0 | cfg_func [15] | lat_dat | |

Fig. 8

| cfg-mod [2:0] | idat [3] | [2] | [1] | [0] | odat_g [1] | [0] | odat-r | Remark |
|---|---|---|---|---|---|---|---|---|
| 010 (2in1out) [mode #2] | | | 0 | 0 | | cfg_func [0] | cfg_func [0] | Upper 2 bits and lower 2 bits for two separate series. Register stores lower 2 bits of result. |
| | | | 0 | 1 | | cfg_func [1] | cfg_func [1] | |
| | | | 1 | 0 | | cfg_func [2] | cfg_func [2] | |
| | | | 1 | 1 | | cfg_func [3] | cfg_func [3] | |
| | 0 | 0 | | | cfg_func [8] | | | |
| | 0 | 1 | | | cfg_func [9] | | | |
| | 1 | 0 | | | cfg_func [10] | | | |
| | 1 | 1 | | | cfg_func [11] | | | |
| 011 (2in1out) [mode #3] | | | 0 | 0 | | cfg_func [0] | | Upper 2 bits and lower 2 bits for two separate series. Register stores upper 2 bits of result. |
| | | | 0 | 1 | | cfg_func [1] | | |
| | | | 1 | 0 | | cfg_func [2] | | |
| | | | 1 | 1 | | cfg_func [3] | | |
| | 0 | 0 | | | cfg_func [8] | | cfg_func [8] | |
| | 0 | 1 | | | cfg_func [9] | | cfg_func [9] | |
| | 1 | 0 | | | cfg_func [10] | | cfg_func [10] | |
| | 1 | 1 | | | cfg_func [11] | | cfg_func [11] | |
| 100 (2in1out) [mode #4] | | | 0 | 0 | | cfg_func [0] | lat_dat | Upper 2 bits and lower 2 bits for two separate series. Register separated. |
| | | | 0 | 1 | | cfg_func [1] | lat_dat | |
| | | | 1 | 0 | | cfg_func [2] | lat_dat | |
| | | | 1 | 1 | | cfg_func [3] | lat_dat | |
| | 0 | 0 | | | cfg_func [8] | | lat_dat | |
| | 0 | 1 | | | cfg_func [9] | | lat_dat | |
| | 1 | 0 | | | cfg_func [10] | | lat_dat | |
| | 1 | 1 | | | cfg_func [11] | | lat_dat | |
| 101 (3in1out) [mode #5] | x | 0 | 0 | 0 | cfg_func [8] | cfg_func [0] | cfg_func [0] | MSB unused. Store value of odat-g[0]. |
| | x | 0 | 0 | 1 | cfg_func [9] | cfg_func [1] | cfg_func [1] | |
| | x | 0 | 1 | 0 | cfg_func [10] | cfg_func [2] | cfg_func [2] | |
| | x | 0 | 1 | 1 | cfg_func [11] | cfg_func [3] | cfg_func [3] | |
| | x | 1 | 0 | 0 | cfg_func [12] | cfg_func [4] | cfg_func [4] | |
| | x | 1 | 0 | 1 | cfg_func [13] | cfg_func [5] | cfg_func [5] | |
| | x | 1 | 1 | 0 | cfg_func [14] | cfg_func [6] | cfg_func [6] | |
| | x | 1 | 1 | 1 | cfg_func [15] | cfg_func [7] | cfg_func [7] | |
| 110 (3in1out) [mode #6] | x | 0 | 0 | 0 | cfg_func [8] | cfg=func [0] | cfg_func [8] | MSB unused. Store value of odat-g[1]. |
| | x | 0 | 0 | 1 | cfg_func [9] | cfg_func [1] | cfg_func [9] | |
| | x | 0 | 1 | 0 | cfg_func [10] | cfg_func [2] | cfg_func [10] | |
| | x | 0 | 1 | 1 | cfg_func [11] | cfg_func [3] | cfg_func [11] | |
| | x | 1 | 0 | 0 | cfg_func [12] | cfg_func [4] | cfg_func [12] | |
| | x | 1 | 0 | 1 | cfg_func [13] | cfg_func [5] | cfg_func [13] | |
| | x | 1 | 1 | 0 | cfg_func [14] | cfg_func [6] | cfg_func [14] | |
| | x | 1 | 1 | 1 | cfg_func [15] | cfg_func [7] | cfg_func [15] | |
| 111 (3in1out) [mode #7] | x | 0 | 0 | 0 | cfg_func [8] | cfg_func [0] | lat_dat | MSB unused. Register separated. |
| | x | 0 | 0 | 1 | cfg_func [9] | cfg_func [1] | lat_dat | |
| | x | 0 | 1 | 0 | cfg_func [10] | cfg_func [2] | lat_dat | |
| | x | 0 | 1 | 1 | cfg_func [11] | cfg_func [3] | lat_dat | |
| | x | 1 | 0 | 0 | cfg_func [12] | cfg_func [4] | lat_dat | |
| | x | 1 | 0 | 1 | cfg_func [13] | cfg_func [5] | lat_dat | |
| | x | 1 | 1 | 0 | cfg_func [14] | cfg_func [6] | lat_dat | |
| | x | 1 | 1 | 1 | cfg_func [15] | cfg_func [7] | lat_dat | |

Fig. 9

| Functions | cfg-mode [2:0] | cfg-func [15:0] | Remarks |
|---|---|---|---|
| Inverter | 010/011/100 | xxxx_xxxx_xxxx_0101 | Use lowest bit |
| 2-input AND | 010/011/100 | xxxx_xxxx_xxxx_1000 | Use lowest 2 bits |
| 2-input NAND | 010/011/100 | xxxx_xxxx_xxxx_0111 | Use lowest 2 bits |
| 2-input OR | 010/011/100 | xxxx_xxxx_xxxx_1110 | Use lowest 2 bits |
| 2-input NOR | 010/011/100 | xxxx_xxxx_xxxx_0001 | Use lowest 2 bits |
| 2-input EXOR | 010/011/100 | xxxx_xxxx_xxxx_0110 | Use lowest 2 bits |
| 2-input EXNOR | 010/011/100 | xxxx_xxxx_xxxx_1001 | Use lowest 2 bits |
| 3-input AND | 101/110/111 | xxxx_xxxx_1000_0000 | Use lowest 3 bits |
| 3-input NAND | 101/110/111 | xxxx_xxxx_0111_1111 | Use lowest 3 bits |
| 3-input OR | 101/110/111 | xxxx_xxxx_1111_1110 | Use lowest 3 bits |
| 3-input NOR | 101/110/111 | xxxx_xxxx_0000_0001 | Use lowest 3 bits |
| FullAdder | 101/110/111 | 1110_1000_1001_0110 | Use lowest 3 bits<br>Set carry in upper output<br>Set sum in lower output |
| 4-input AND | 000/001 | 1000_0000_0000_0000 | |
| 4-input NAND | 000/001 | 0111_1111_1111_1111 | |
| 4-input OR | 000/001 | 1111_1111_1111_1110 | |
| 4-input NOR | 000/001 | 0000_0000_0000_0001 | |
| 4-input EXOR | 000/001 | 0111_1111_1111_1110 | |
| 4-input NOR | 000/001 | 1000_0000_0000_0001 | |
| AND_AND_OR | 000/001 | 1000_1000_1000_1000 | |
| AND_AND_NOR | 000/001 | 0111_0111_0111_0111 | |
| 4-input comparater(1111) | 000/001 | 1000_0000_0000_0000 | Set value to be compared at 1 |

```
st1 <= st0
st2 <= st1
st0 <= st2
adderout = (st2 ? R1:a)+(st2 ? R3:b)
shifterout = (st1 ? R1:a)+(st1 ? R2:d)
R1 <= st1 ? shifterout : adderout
R2 <= c
R3 <= st1 ? R3 : shifterout
z = adderout
```

Fig. 21

```
st1 <= st0
st2 <= st1
st0 <= st2
if(st0)then
   NextCircuit = #1
elsif(st1)then
   NextCircuit = #2
else
   NextCircuit = #0
end
```
— 34

DATA PROCESSING APPARATUS INCLUDING RECONFIGURABLE LOGIC CIRCUIT

CROSS-REFERENCE TO RELATED APPLICATIONS

This is a division of U.S. application Ser. No. 11/718,195 filed Jul. 19, 2007, which is the U.S. National Phase of PCT/JP2005/19924 filed Oct. 28, 2005, based on JP 2004-313710 filed Oct. 28, 2004, the entire respective disclosures of which are incorporated herein by reference.

TECHNICAL FIELD

The present invention relates to a data processing apparatus including a reconfigurable logic circuit.

BACKGROUND ART

An FPGA (Field Programmable Gate Array) is known as a programmable device in which circuits can be reconfigured. As one technology that implements different parts of a logic circuit in an FPGA, Japanese Laid-Open Patent Publication No. 2000-40745 discloses a technology for dividing an initial net list that defines the logic circuit into many pages and implements a circuit for one of such pages in the FPGA. By doing so, this technology aims to make it possible to implement a much larger circuit than the physical capacity of the FPGA. Japanese Laid-Open Patent Publication No. 2003-518666 discloses a technology that divides a design net list into sets of static macros and sets of reconfigurable macro contexts, compiles the respective reconfigurable contexts, and carries out placing and routing for the initial device contexts.

DISCLOSURE OF THE INVENTION

Although an FPGA might be capable of dynamically reconfigurable, at least several tens of cycles will be required by programming, during which time meaningful processing cannot be carried out. Accordingly, the method that reconfigures the set of hardware described above has a premise of carrying out grouped-together processing with a given configuration being used for 500 to 1,000 cycles or more every time reconfiguration is carried out. That is, the circuits to be reconfigured are functional modules that are case-specific for respective modes and have a fairly large significance as independent configurations, such as "a processing circuit for a parity mode" and "a processing circuit for a non-parity mode". When reconfiguring on this type of functional module level is not possible or useful for an application, applying the conventional art described above is not effective.

One of aspects of the present invention is providing a technology for implementing a circuit for carrying out an application in hardware that can be reconfigured on a cycle basis. For such hardware, the circuit configuration can be changed in every cycle. Accordingly, it becomes possible to not only carry out dynamic reconfiguring at the functional module level in units of 500 to 1000 cycles using the conventional art described above, but also to carry out reconfiguring in more precise time units or cycles, thereby increasing the range for which dynamic reconfiguring can be applied. By quantitatively changing the reconfiguration time from several tens of cycles to just one cycle, the usage of such reconfiguration qualitatively changes from the functional module level to the behavior (action and/or response) state level. One of other aspects of this invention is providing control information and a method suited to control of a data processing system (apparatus, device) equipped with a reconfigurable logic circuit.

A first aspect of the present invention is a data processing apparatus (system, device) that includes a logic circuit that is reconfigurable in each cycle and a library in which hardware control information is stored. The hardware control information includes: a plurality of pieces of cycle-based mapping information for individually mapping a plurality of cycle-based circuits, which each realize a function in each cycle for executing an application, onto the logic circuit; and configuration selection information for selecting at least one of the plurality of pieces of cycle-based mapping information according to an execution state of the application. The data processing apparatus further includes a control unit that reconfigures, according to a request in each cycle based on the configuration selection information, at least part of the logic circuit using at least one of the plurality of pieces of cycle-based mapping information.

The plurality of pieces of cycle-based mapping information may include a piece or pieces of composite cycle-based mapping information produced by merging pieces of cycle-based mapping information that are capable of being merged without obstructing the functions in each cycle. Also, each of the plurality of pieces of cycle-based mapping information may include information for mapping a control unit for each cycle onto the logic circuit, and in this case, the control unit for each cycle is reconfigured in the logic circuit.

One of other aspects of the present invention is a data processing apparatus that includes a logic circuit that is reconfigurable in each cycle and a library in which hardware control information is stored, wherein at least part of the logic circuit is reconfigured using at least one of a plurality of pieces of cycle-based mapping information according to a request in each cycle based on configuration selection information. When the plurality of pieces of cycle-based mapping information each include information for mapping a control unit for each cycle onto the logic circuit, at least part of the logic circuit is reconfigured according to a request by the control unit for each cycle reconfigured in the logic circuit.

Yet one of other aspects of the present invention is a method of controlling a data processing apparatus, which includes a logic circuit that is reconfigurable in each cycle. The method includes a step of reconfiguring at least part of the reconfigurable logic circuit based on hardware control information. The step of reconfiguring includes selecting at least one of the plurality of pieces of cycle-based mapping information according to a request in each cycle based on the configuration selection information and reconfiguring at least part of the logic circuit using the selected piece of cycle-based mapping information. When each of the plurality of pieces of cycle-based mapping information includes information for mapping a control unit for each cycle onto the logic circuit, the step of reconfiguring includes reconfiguring at least part of the logic circuit according to a request by the control unit for each cycle that has been reconfigured in the logic circuit.

Yet one of other aspects of the present invention is a generation system for generating hardware control information for controlling a reconfigurable logic circuit, the generation system including: a functional unit for generating circuit information of a plurality of cycle-based circuits that each realize a function in each cycle for executing an application; and a functional unit for generating the hardware control information.

Yet one of other aspects of the present invention is a method of generating information for controlling a reconfigurable logic circuit, the method including the steps of: generating circuit information of a plurality of cycle-based circuits that each realize a function in each cycle for executing an application; and generating the hardware control information that includes a plurality of pieces of cycle-based mapping information for individually mapping the plurality of cycle-based circuits onto the logic circuit and configuration selection information for selecting at least one out of the plurality of pieces of cycle-based mapping information according to an execution state of the application.

When generating a fixed circuit, even if the functions in each cycle are extracted, there is no need to realize the functions in each cycle as circuits in each cycle. Instead, a logic circuit that is fixed in real space is generated to realize the functions in each cycle. One of samples of the fixed circuits have a pipeline are generated by combining the functions in each cycle across a range that exceeds cycles in accordance with the transmission of signals. One of other samples of the fixed circuits have selectors disposed for making shared use of logic elements such as computing elements and registers and generating an integrated circuit that covers all of the functions in all of the cycles. The result of this kind of circuit design is normally expressed at RTL (Register Transfer Level). In addition, logic synthesizing is carried out for the RTL to generate a net list and placing and routing are carried out to implement the design in hardware.

With the present invention, the functions in each cycle are converted to circuits in each cycle. Since cycles normally proceed in units of clocks, also with the present invention, the functions in each clock are converted to circuits in each clock. If the information of cycle-based circuits (hereinafter also referred to as "CB circuit information") for realizing the respective functions in each cycle to execute a given application are described in RTL, cycle-based RTL will be generated.

By using a plurality of pieces of cycle-based mapping information (hereinafter also referred to as "CB mapping information") for mapping the plurality of cycle-based circuits onto a reconfigurable logic circuit individually (respectively), it is possible to reconfigure cycle-based circuits (hereinafter also referred to as "CB circuits") onto the reconfigurable logic circuit in cycle units (in each cycle). If a logic synthesizing tool is used, the RTL for each cycle is converted by the logic synthesizing tool to a net list for each cycle and place and routing are carried out to generate CB mapping information. In this procedure, there are fundamentally no processes such as the insertion of flip-flops to create a pipeline, no disposing of selectors to switch the inputs of logic elements, such as computing elements and registers, so as to make shared use of such elements, and no generation of selector control signals.

Accordingly, the configuration of the CB circuits mapped on a reconfigurable logic circuit is a simple configuration that expresses only the parts of data paths that are required in each cycle and fundamentally does not include selectors and the like for switching inputs, and can be implemented with fewer logic elements. Also, selector control signals for switching the input of logic elements to select the logic are not required, and instead logic is selected according to configuration selection information that selects the CB mapping information according to the execution state of the application. Therefore, according to the present invention, it is possible to change a reconfigurable circuit region from being used at a functional module level to being used at a behavior state level.

The method should preferably include a step of generating composite cycle-based mapping information that includes extracting, out of the plurality of pieces of cycle-based mapping information, some pieces cycle-based mapping information that are capable of being merged without obstructing the functions in each cycle and merging two or more pieces cycle-based mapping information extracted. This step is carried out not to combine circuits across cycles in accordance with signals transmitted between cycles but to reduce the number of types of pieces of CB mapping information and to reduce the size of the CB mapping information required to execute the application. Accordingly, instead of selecting and merging cycle adjacent pieces of CB mapping information as the timing for mapping, merging includes (i) the merging of information that have non-consecutive timing but share common features in the configuration of the CB circuits to generate piece of composite CB mapping information equipped with circuit that is not required for the functions in a given cycle but does not obstruct such functions, and (ii) the merging of smaller pieces of CB mapping information to generate an independent CB circuit expressed by one piece of composite CB mapping information.

The step of generating the hardware control information can includes generating pieces of the configuration selection information in each cycle and merging a piece of configuration selection information with a piece of cycle-based mapping information. Here, since a circuit that generates the configuration selection information in each cycle is included in the CB circuits mapped by the CB mapping information, it is possible to execute the application by mapping or reconfiguring CB circuits in a reconfigurable logic circuit.

The step of generating the circuit information can includes generating information of the plurality of cycle-based circuits based on a control data flow graph for executing the application. For example, when the specification of an application is provided by a high-level language such as C, it is possible to generate the CB circuit information from the C language and to then generate the CB mapping information. The step of generating circuit information can includes resolving or dividing RTL for executing the application on a cycle basis and generating information of the plurality of cycle-based circuits. Here, it is possible to use RTL resources where design has already progressed as far as the RTL to generate the CB circuit information and then to generate the CB mapping information.

The hardware control information of the present invention can be provided having been recorded on a suitable recording medium such as a ROM. The hardware control information can also be transmitted across wires or wirelessly using a computer network, such as the Internet. It is also possible to execute an application using a data processing apparatus including a reconfigurable logic region.

BRIEF DESCRIPTION OF THE DRAWINGS

FIG. 7 shows a part of operations of the operation core.

FIG. 8 shows another part of operations of the operation core.

FIG. 9 shows a part of a logic operation that can be executed by the operation core.

FIG. 16(a) shows an example of a circuit for an ASIC or an FPGA and FIG. 16(b) shows one example of an FSM.

FIG. 21 shows selection configuration information.

DETAIL DESCRIPTION

Figure 1:
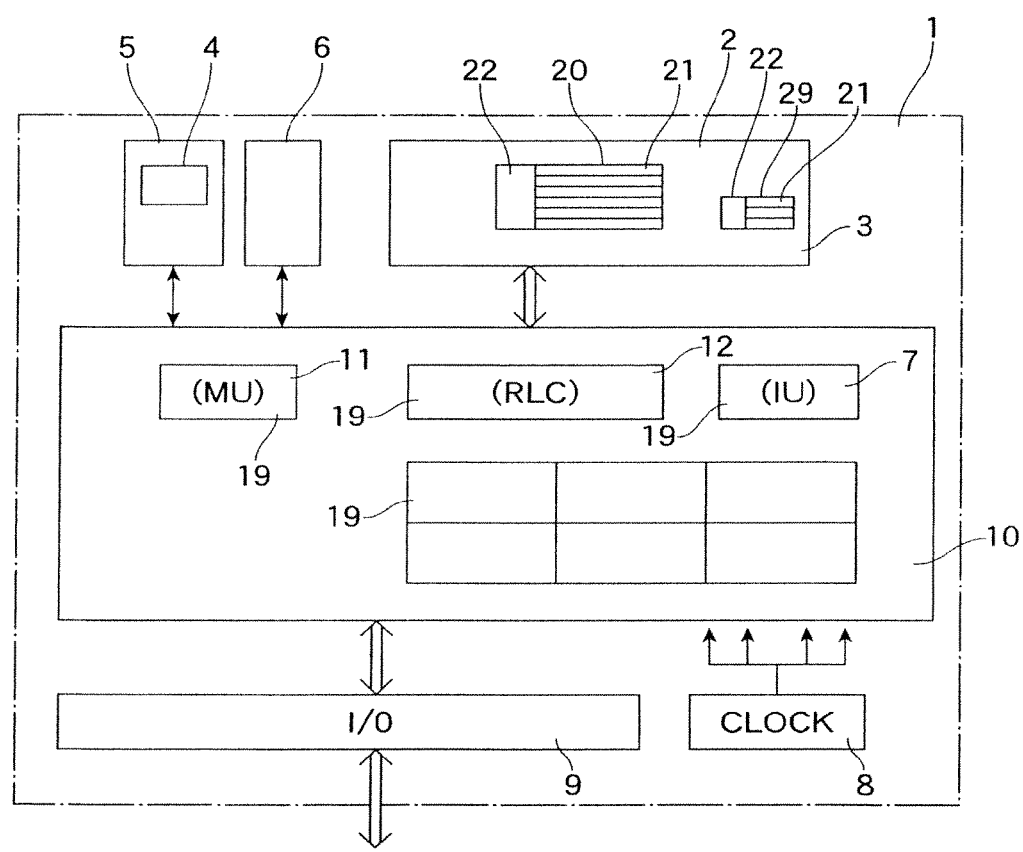
FIG. 1 schematically shows a block-diagram of a data processing apparatus which is controlled by hardware control information.

A data processing apparatus (system) 1 shown in FIG. 1 is an electronic device, such as an LSI, IC, chip, or chipset and is equipped with a logic circuit region (or "RC region" or "reconfigurable region") 10 in which circuits can be dynamically reconfigured and a memory 3 for a library 2 in which hardware control information 20 for executing a number of applications is stored (recorded). The same type system as the data processing apparatus 1 may be constructed as an optical device or an electro-optical device. This data processing apparatus 1 further includes a mapping unit (MU) 11. The MU 11 is a control unit for reconfiguring cycle-based circuits (CB circuits) 19 by obtaining ("fetching" or "downloading") desired piece or pieces of cycle-based mapping information (CB mapping information) 21 out of the hardware control information 20 from the library 2 and mapping the CB mapping information 21 onto the RC region 10 or a suitable region that is part of the RC region 10. The data processing apparatus 1 further includes a rapid loading control unit (RLC) 12 that initializes the hardware and/or decodes selection information 22 out of the hardware control information 20 to select the desired piece or pieces of CB mapping information 21. In addition, the data processing apparatus 1 is equipped with a RAM 5 in which an application program 4 is stored, a work memory 6, an interrupt control unit (IU) 7 that receives interrupt signals, a clock generator 8 that supplies a clock signal to the various hardware resources of the data processing apparatus 1, and a data input/output interface 9 that controls the inputting and outputting of data into and from an external memory.

The MU 11, the RLC 12 and the IU 7 can also be implemented or realized in a data processing apparatus by fixed circuits. In the data processing apparatus 1, the functions of the MU 11, the RLC 12, and the IU 7 are realized by mapping or reconfiguring desired circuits in the RC region 10 using the CB mapping information 21. Accordingly, hardware control information 29 for configuring circuits that support the fundamental system of the data processing apparatus 1 is also stored in the library 2.

Figure 2:
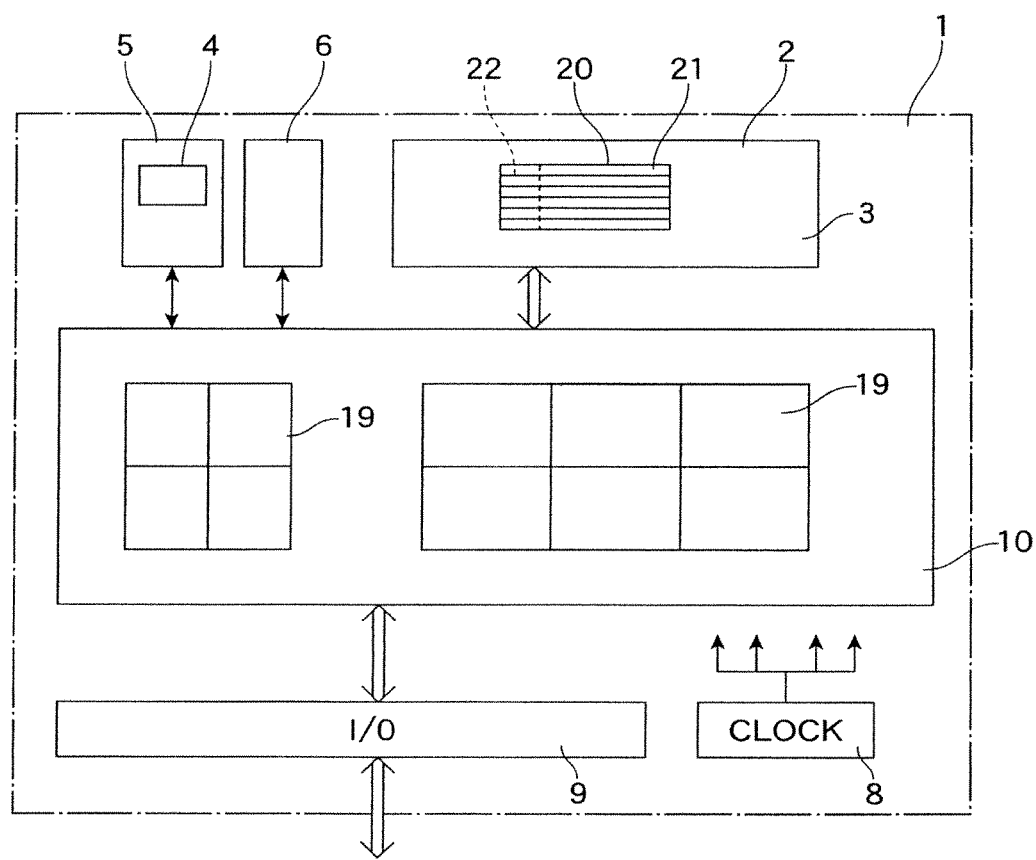
FIG. 2 schematically shows a block-diagram of a different data processing apparatus to FIG. 1.

FIG. 2 schematically shows a block-diagram of a different data processing apparatus. This data processing apparatus 1 is also a data processing apparatus that includes an RC region 10, which is a logic circuit that can be reconfigured in each cycle, and a memory 3 for a library 2 in which hardware control information 20 is stored. In addition, with the data processing apparatus 1 shown in FIG. 2, information for generating circuits for providing the functions of the MU 11 and the RLC 12 is included in some or respective pieces of CB mapping information 21 of the hardware control information 20. Accordingly, in each cycle, or according to requests in each cycle, such circuits are reconfigured in the RC region 10 as CB circuits 19 together with circuits for executing an application. In addition, the selection information 22 is divided on a cycle basis and is included in the CB mapping information 21. Accordingly, the entire RC region 10 is a region that can be reconfigured on a cycle basis to execute a given application. When a plurality of applications are simultaneously executed, different CB circuits 19 are reconfigured in the RC region 10 to execute the plurality of applications.

The reconfigurable region 10 can be reconfigured on a cycle basis (on a clock basis), but does not need to be reconfigured in every cycle. In view of the power consumption and the like required to reconfigure circuits, there are also cases where circuits that do not need to be reconfigured on a cycle basis should preferably not be reconfigured in every cycle. In addition, if there are sufficient hardware resources in the reconfigurable region 10 and it is known that a configured CB circuit 19 will be used again several clocks (several cycles) later, it is effective to keep such CB circuit 19. Accordingly, the circuits to be configured in the RC region 10 to execute the application are a number of CB circuits 19 divided and all or some of such CB circuits 19 are reconfigured according to requests in each cycle.

Figure 3:
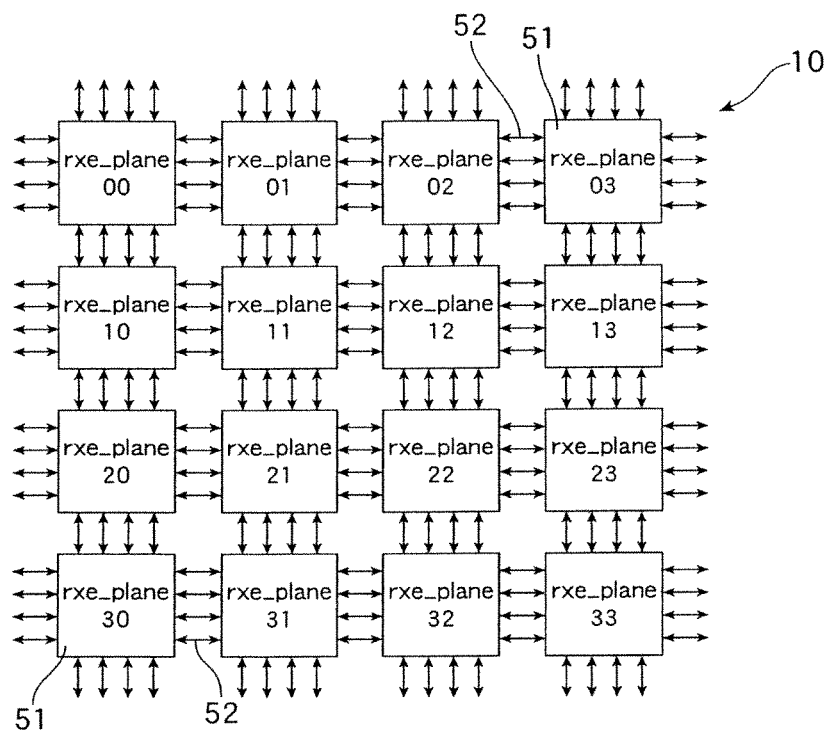
FIG. 3 shows a hardware layout of an RC region in which circuits can be reconfigured on a cycle basis.

FIG. 3 shows an example of an RC region 10 in which circuits can be reconfigured on a cycle basis. The RC region 10 is equipped with circuit blocks (rxe_plane) 51 that are arranged in a lattice (an array or a matrix) and are groups of a plurality of elements whose individual logic operations can be changed and wires 52 for interconnecting the circuit blocks 51. The CB mapping information 21 should preferably be generated so as to map the CB circuits 19 in units of the circuit blocks 51. That is, when the CB circuits 19 for realizing the functions of a given cycle are mapped so as to consume a plurality of circuit blocks 51, it is preferable to generate the CB mapping information 21 so that the CB circuits 19 are configured by a plurality of pieces of CB mapping information 21 corresponding to the number of circuit blocks 51. By doing so, when a CB circuit 19 that realizes the function in the following cycle can be realized by reconfiguring one or a plurality of circuit blocks 51, it is possible to reduce the size of the CB mapping information 21 used for mapping. It is also possible to merge some pieces of the CB mapping information 21 together in units of the circuit blocks 51 to reduce the size of the information.

Figure 4:
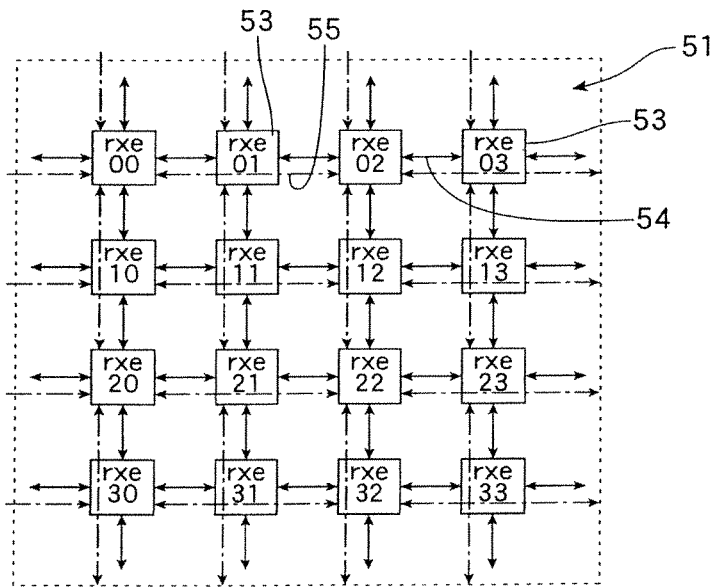
FIG. 4 shows the layout of elements.

FIG. 4 shows a block-diagram of one circuit block 51. In this circuit block 51, sixteen logic elements 53 are laid out in a four-by-four array. The respective logic elements 53 are connected to the adjacent logic elements 53 above, below, on the left, and on the right in FIG. 4 by four-bit layer #1 buses 54. In addition, layer #2 buses 55 that jump over (pass) the adjacent logic elements 53 above, below, on the left, and on the right to connect logic elements 53 located further out are also provided. This means that it is possible to connect the logic elements 53 more flexibly. Further layer buses such as layer #3 buses that connect logic elements 53 three positions away may also be provided.

The respective logic elements 53 are equipped with a function as a logic operation element and a function as a wiring switch that switches the connections between logic elements. Since it is necessary to change or exchange the logic to be operated and the state of the wire connections at high speed, elements called RXE (Rapid exchange Elements) 53 capable of high-speed exchanging operations are disposed in the RC region 10.

Figure 5:
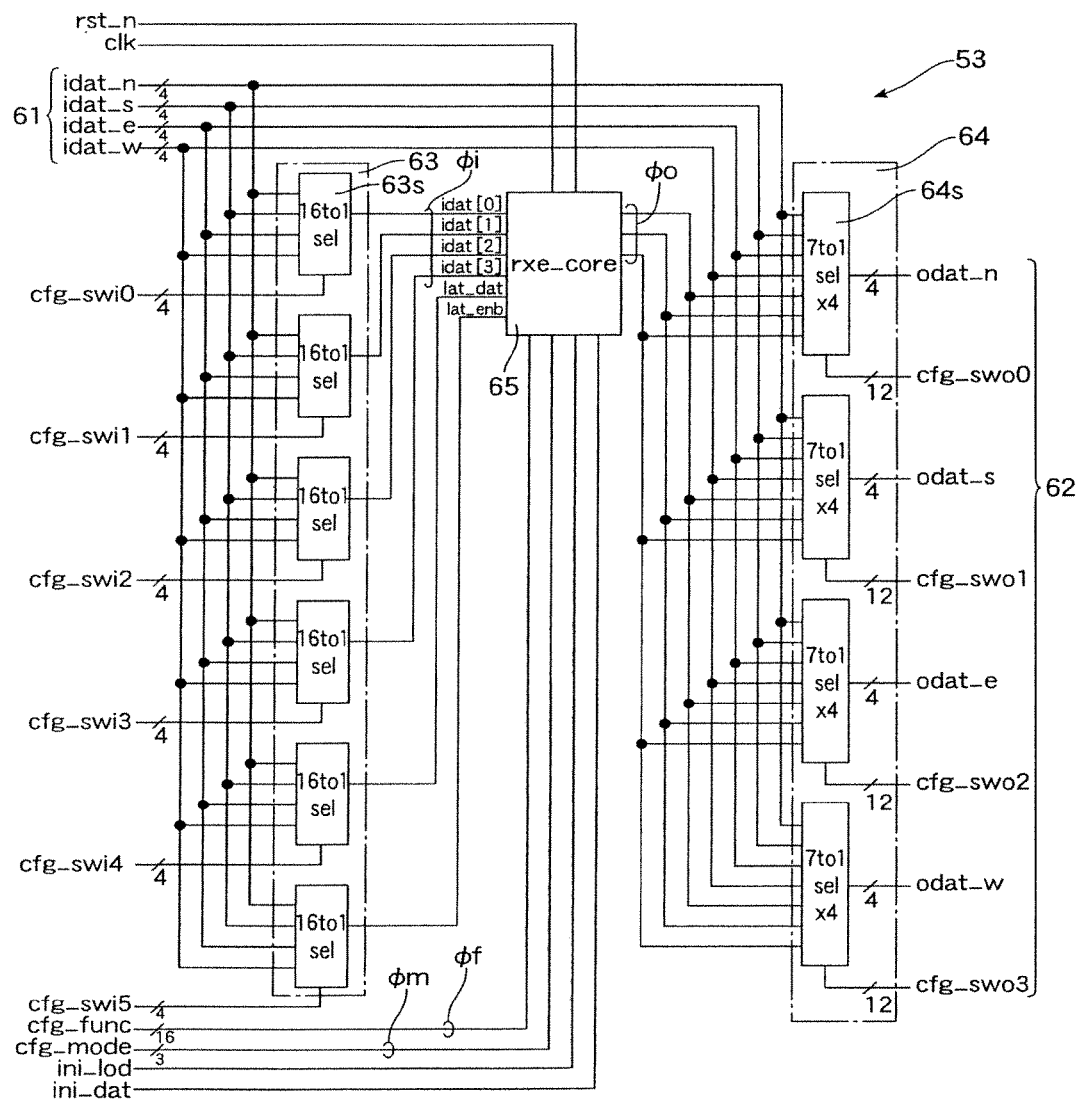
FIG. 5 shows a block-diagram of an element.

FIG. 5 shows a block-diagram of an RXE 53. The RXE 53 is equipped with four inputs 61 for inputting four series of data, four outputs 62 for outputting four series of data, an input interface 63 that freely selects input data from the four series of data from the inputs 61, an operation core 65 that carries out a logic operation on the input data $\phi i$ selected by the input interface 63 and outputs data, and an output interface 64 that freely selects the four series of data of inputs 61 and the output data $\phi o$ of the operation core 65 and connects the selected data to any of the four outputs 62. The operation core 65 is configured so that the logic operation can be changed and functions as an operation element whose logic can be changed. The input interface 63 has a plurality of 16-to-1 selectors 63s for freely selecting one bit from the four series of data of inputs 61. The output interface 64 has a plurality of 7-to-1 selectors 64s that route the output $\phi o$ from the operation core 65 and the four series of data of inputs 61.

Figure 6:
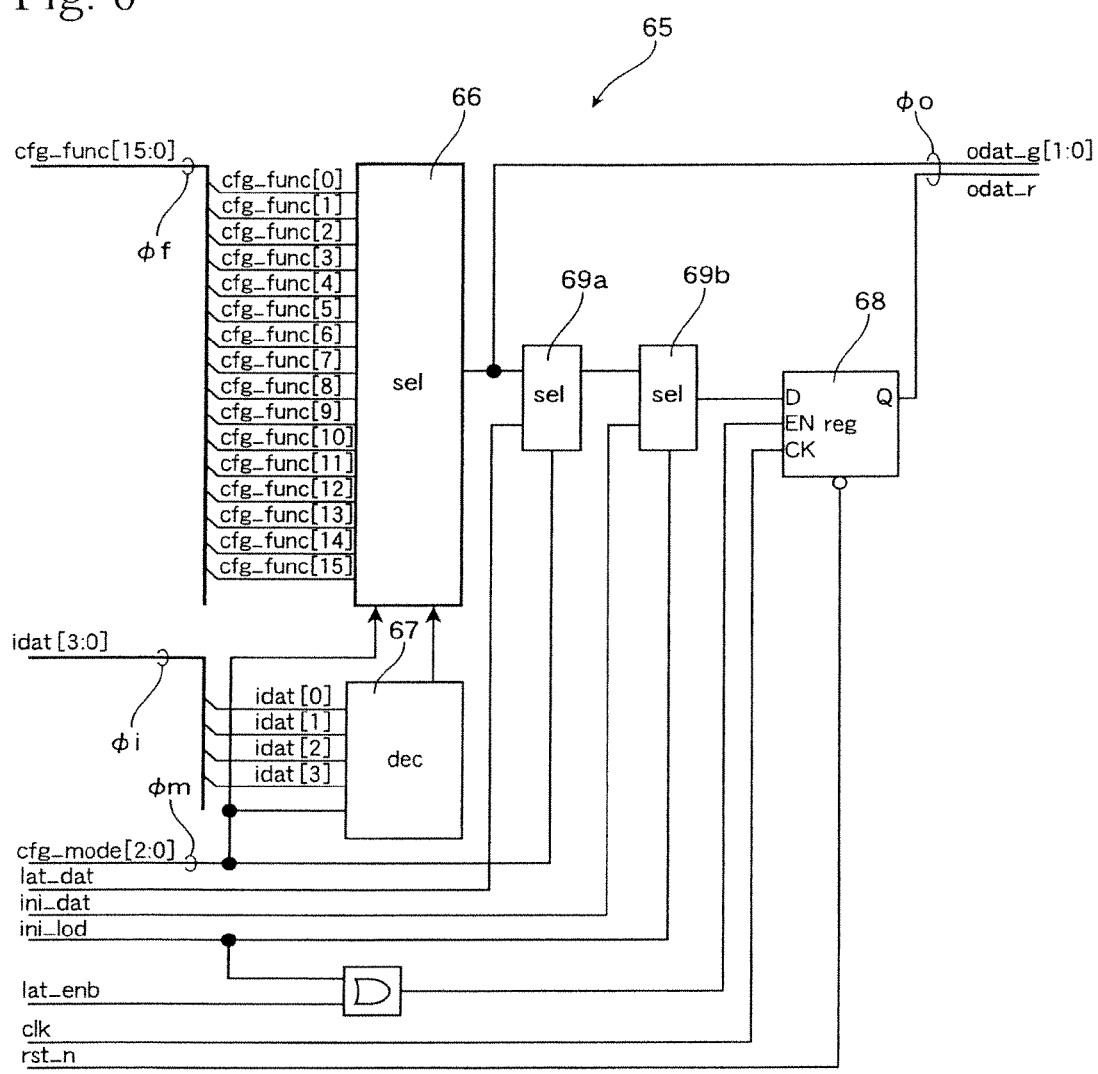
FIG. 6 shows a block-diagram of an operation core.

FIG. 6 shows a block-diagram of the operation core (rxe_core) 65. The operation core 65 is equipped with a selector 66 that has a 16-bit function code $\phi f$ for designating a logic operation as an input and selects the output data $\phi o$ according to the input data $\phi i$. The operation core 65 is further equipped with a decoder 67 that decodes the four-bit input data $\phi i$ to generate a selection signal for the 16-bit selector 66, a register 68 that latches data from one of the four series of data of inputs 61 or the output data $\phi o$, and selectors 69a and 69b for selecting the signal to be latched in the register 68.

FIGS. 7 and 8 show operations of the operation core 65. The operation core 65 changes its operation according to the mode signal $\phi m$. In mode #0 in FIG. 7, the operation core 65 generates 1-bit output data $\phi o$ from the 4-bit input data $\phi i$, latches the output data $\phi o$ in the register 68, and outputs the output data $\phi o$. In mode #1 in FIG. 7, the operation core 65 generates 1-bit output data $\phi o$ from the 4-bit input data $\phi i$ and outputs the output data $\phi o$ without latching the output data $\phi o$ in the register 68. The output data $\phi o$ depends on the 16-bit function code $\phi f$ and the result of decoding the input data $\phi i$. Accordingly, as collectively shown in FIG. 9, in mode #0 and mode #1, by changing the function code $\phi f$, it is possible to use the operation core 65 as nine or more types of logic operation element such as a four-input AND, a four-input comparator and others as shown in FIG. 9.

In addition, the operation core 65 carries out a logic operation for a combination of the selector 66 and the function code $\phi f$. This means that unlike a conventional FPGA, it is not necessary to set logic in a lookup table (LUT) that uses a memory element such as an SRAM. Accordingly, it is possible to omit cycles that carry out input/output for the SRAM, and it is possible to instantly switch the operation carried out by the operation core 65 at the timing when the function code $\phi f$ is outputted to the operation core 65. For this reason, the operation core 65 is referred to as a "rapid exchange element". By switching the supplied function code $\phi f$ on a cycle basis (a clock basis), it is possible to change the operation function on a cycle basis. The functions of the input interface 63 and the output interface 64 can also be changed on a cycle basis. Accordingly, it is possible to change the functions of and connections between the RXE 53 in each cycle and therefore possible to configure different circuits in each cycle in the RC region 10 that has the RXE 53.

In mode #2 to mode #4 shown in FIG. 8, a single operation core 65 functions as two operation elements that respectively output 1-bit output data $\phi o$ for 2-bit input signals $\phi i$. That is, the included 16-to-1 selector 66 is set so as to operate as two 4-to-1 selectors. In modes #2 to #4, as shown in FIG. 9, by changing the function code $\phi f$, the operation core 65 can be used as seven or more types of logic operation element such as an inverter, a two-input EXNOR and others as shown in FIG. 9.

In addition, in mode #5 to mode #7 shown in FIG. 8, the operation core 65 can be used as an operation element that outputs 1-bit output data $\phi o$ for a 3-bit input signal $\phi i$. If the input of an additional bit is permitted, the included 16-to-1 selector 66 can be set so as to operate as two 3-to-1 selectors, and therefore the operation core 65 can be used as two 3-bit input/1-bit output operation elements. In mode #5 to mode #7, as shown in FIG. 9, by changing the function code $\phi f$, the operation core 65 can be used as five or more types of logic operation element such as a three-input AND, a full adder and others as shown in FIG. 9.

In this way, the logic of the RXEs 53 included in the RC region 10 can be exchanged at high-speed using selectors. In addition, the RXEs 53 internally include the registers 68 that latch the output data and are also capable of directly outputting the output data, so that the output data can be outputted after being synchronized with a clock using a flip-flop. Accordingly, a combinational circuit (a decoder), a sequential circuit (a state machine) and an operation circuit (a data path) that are often used in digital circuits can be efficiently implemented and executed by the CB mapping information 21 of the hardware control information 20.

The elements (RXE) 53 of the present embodiment whose logic can be reconfigured are based on a two-dimensional array or matrix layout. Accordingly, four input/outputs for four series of data that are suited to being disposed in a two-dimensional array are provided. However, if the network that connects the elements is one-dimensional, two or three inputs and outputs can be used instead. In addition, if the network that connects the elements is three dimensional, five or more inputs and outputs should preferably be provided. In addition, although the operation core (rxe_core) uses selectors to make it possible to carry out exchanging operations at high speed, if the exchanging of logic is permitted to take multiple cycles, it is also possible to use an operation core equipped with a lookup table (LUT).

Figure 10:
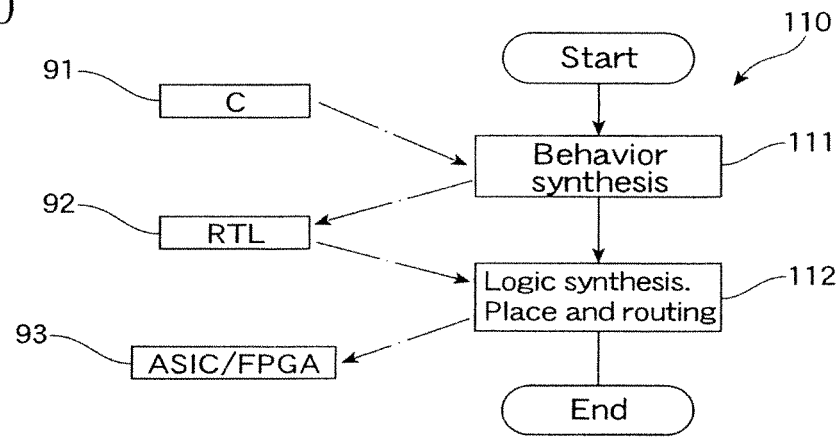
FIG. 10 is a flowchart showing a procedure for fixing a hardware configuration from a C language specification for an FPGA or an ASIC.

FIG. 10 shows one example of a method of designing an ASIC or an FPGA. This design method 110 is a method that generates a circuit 93 to be implemented in an ASIC or an FPGA from a behavior level description written in C language 91 or the like, and is being used more frequently in recent years as the scale of circuit to be designed increases. This design method 110 includes a process 111 called "behavior synthesis" that uses a behavior synthesizing tool to generate a hardware description 92 provided by RTL (Register Transfer Level) from a behavior level description written in C language 91 or the like, and a process 112 that generates a circuit 93 for implementing the RTL description (hereinafter RTL) 92 in an ASIC or an FPGA using a logic synthesizing tool and a place and routing tool. RTL 92 is an expression of circuit functions using hardware description language such as Verilog or VHDL. In the process 112, by using a logic synthesizing tool and a place and routing tool for an ASIC or for an FPGA, the RTL 92 is converted to a desired ASIC mask pattern or FPGA configuration information. This design method 110 is also referred to as "behavior synthesis method". By using a computer equipped with suitable hardware resources, software (a program) that carries out the above processes is provided as a behavior synthesis tool that supports the design and development of an ASIC and/or an FPGA. Many behavior synthesis tools are constructed of a combination of tools (programs) that carry out such processes.

Figure 11:
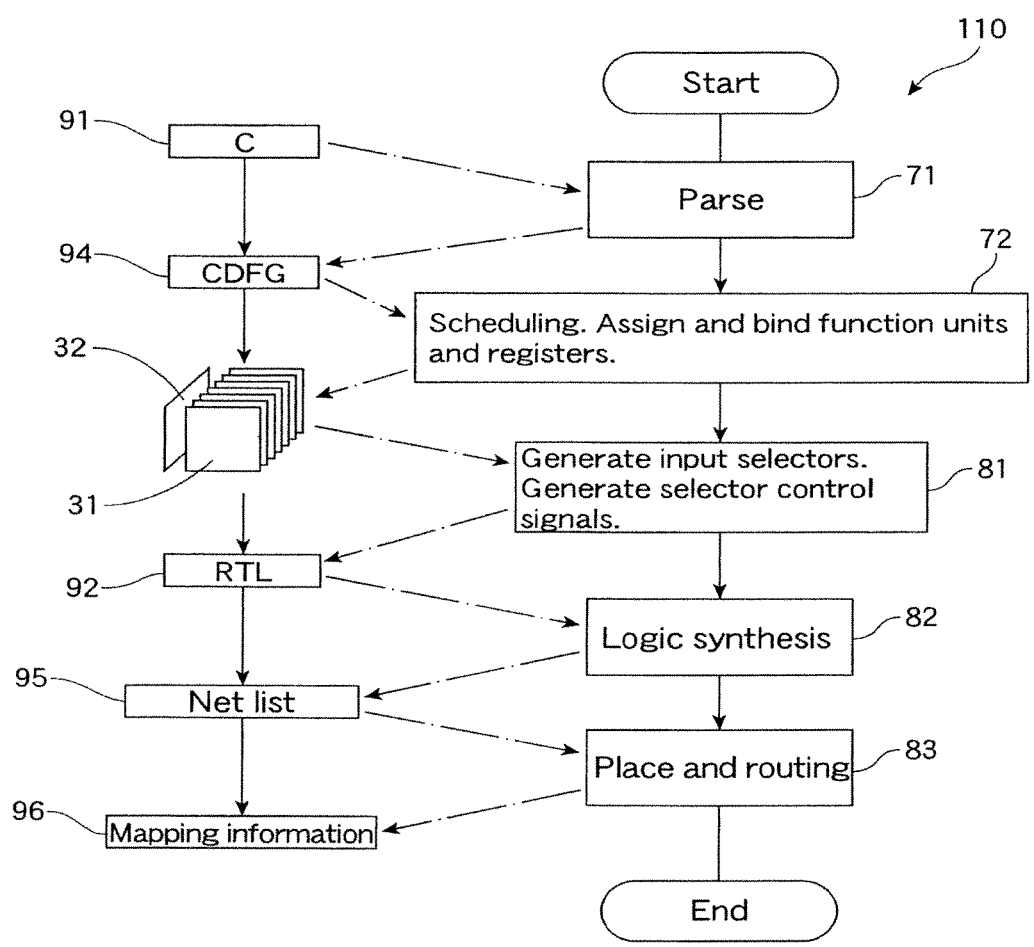
FIG. 11 is a flowchart showing the procedure for generating an ASIC mask pattern or FPGA configuration information in more detail.

FIG. 11 is a flowchart showing the processing of a behavior synthesis tool for ASIC/FPGA. In step 71, the behavior synthesis tool first parses the behavior level description 91 which is written in C language or the like and generates a CDFG (Control Data Flow Graph) 94. In step 72, scheduling, the assigning of computing elements, and the assigning of registers are carried out to generate data paths 31 that realize the functions in each cycle and a control state machine 32.

In step 81, these data paths 31 are combined to create a pipeline and/or to share operating elements and registers so that the processing can be realized using the fewest possible hardware resources. In this process, input selectors may be inserted on the input sides of the operating elements and registers, and flip-flops may be inserted to synchronize the timing. The control state machine 32 is generated so as to output suitable selector control signals. From the data paths 31 and the control state machine 32, a target RTL (hardware description) 92 is generated. In step 82, a net list 95 is generated by a logic synthesizing tool and after this, in step 83, timing convergence and the like are investigated by a place and routing tool and a mask pattern for manufacturing an ASIC and/or configuration information 96 for mapping onto an FPGA are generated.

Figure 12:
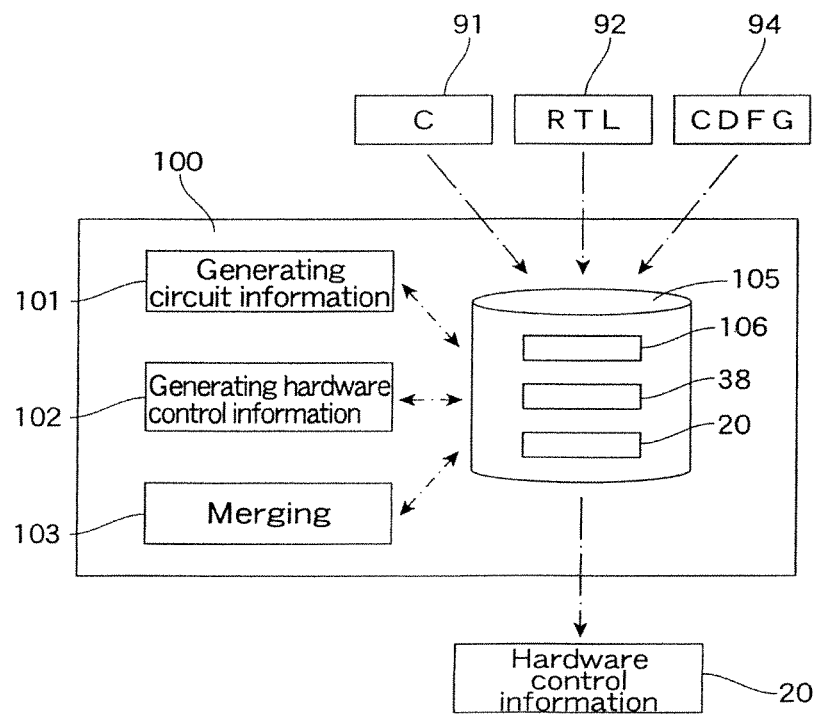
FIG. 12 is a block diagram schematically showing a generation system for hardware control information.

FIG. 12 schematically shows a system 100 that generates the hardware control information 20 for controlling the data processing apparatus 1 equipped with the RC region 10. The RC region 10 is a logic circuit in which circuits can be reconfigured on a cycle basis. The generation system 100 receives input information 106 into a storage device 105 such as a HDD. The generation system 100 includes a function (functional unit) 101 generates, from the input information 106, circuit information 38 for a plurality of cycle-based circuits that respectively realize the functions in each cycle to execute an application, and a function (functional unit) 102 that generates the hardware control information 20. These functional units 101 and 102 may transfer the information 38 and 20 generated by the functional units via communication between the functional units or may exchange information by storing the information in a storage device 105. The hardware control information 20 includes a plurality of pieces of cycle-based mapping information (CB mapping information) 21 for respectively mapping circuits out of the plurality of cycle-based circuits to the RC region 10 and configuration selection information 22 for selecting at least one of the plurality of pieces of cycle-based mapping information 21 according to the execution state of the application. The generation system 100 also includes a functional unit 103 that merges some pieces of CB mapping information 21 to generate the hardware control information 20 that includes composite cycle-based mapping information.

The input information 106 of the generation system 100 may be the specification of the target application itself, for example an application program, or may be hardware information that has already been generated to execute the application. The concept of "input information 106" includes a specification based on a high-level language provided by the C language program 91 or the like, a dataflow-based specification such as the CDFG 94, and a circuit information-based specification such as the RTL 92.

The generation system 100 is provided as a tool for supporting the designing and development of the data processing apparatus 1. In the same way as a compiler and other design support tools, the generation system 100 is realized by installing software (i.e., a program product) for realizing the functional units of the generation system 100 on a computer equipped with suitable hardware resources. The respective functional units 101 to 103 can be provided as tools (i.e., program products) for carrying out the respective processes or steps by recording the program products on a suitable recording medium such as a CD-ROM or can be provided via a computer network. The generation system 100 can also be realized by a distributed system composed of a plurality of servers that are connected by a computer network.

Figure 13:
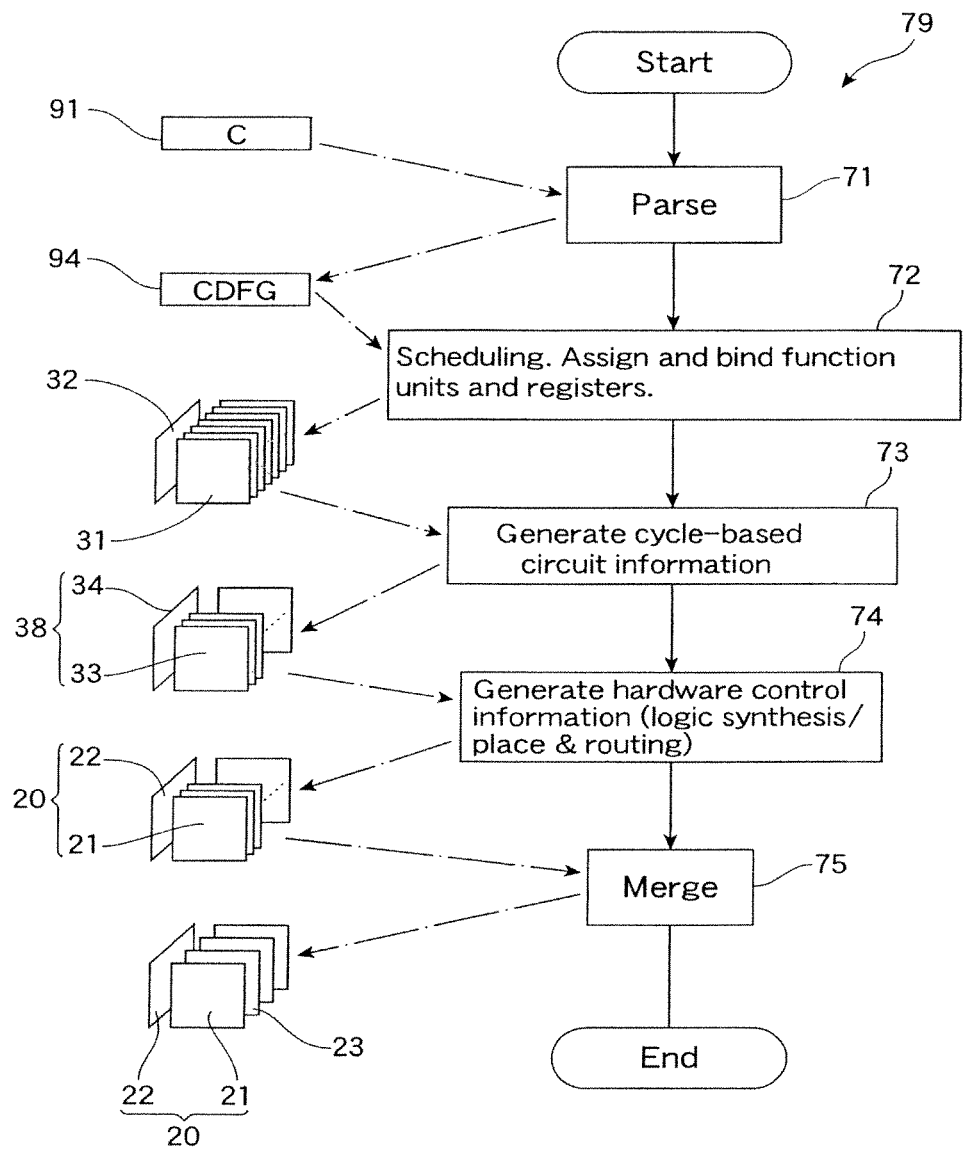
FIG. 13 is a flowchart showing a method that generates the hardware control information.

FIG. 13 is a flowchart showing the generation method 79 for the hardware control information 20 that includes suitable information for mapping onto the RC region 10 in which circuits can be reconfigured on a cycle basis. The method 79 of generating the hardware control information 20 is one example of a generation method that can be executed by the generation system 100, with the processing flow of the method changing according to factors such as the type of information inputted as the specification.

In the flowchart shown in FIG. 13, first, in step 71, the behavior level description 91 written in C language or the like is parsed or analyzed and the CDFG 94 is generated. In step 72, scheduling, the assigning of processing elements, and the assigning and/or integrating of registers are carried out to generate the data paths 31 that realize the functions in each cycle (i.e., cycle-based data paths) and the control state machine (control FSM (Finite State Machine)) 32. In the following step 73, the cycle-based data paths 31 are written in descriptions (pieces) of RTL 33 of cycle-basis that is circuit information (i.e. CB circuit information) for cycle-based circuits (i.e., CB circuits) that realize the functions in each cycle. In this step 73, the functions of the control state machine 32 are converted into selection information 34 that selects a cycle-based configuration. In this example, information including the CB circuit information 33 and the selection information 34 are supplied to the next step as the circuit information 38 of a cycle-based circuit.

In step 74, logic synthesizing and place and routing are carried out for the respective descriptions (pieces) of RTL 33 in each cycle to generate hardware control information that includes pieces of CB mapping information 21 for mapping onto the RC region 10 in each cycle and configuration selection information 22 that selects such pieces of CB mapping information 21 on a cycle basis.

In addition, in step 75, to make the circuit scale to be mapped (to be configured) more uniform in each cycle, some pieces of the information, out of the plurality of pieces of CB mapping information 21, that can be merged or combined without obstructing the function in each cycle are merged to generate a piece or pieces of composite (merged or combined) cycle-based mapping information (composite CB mapping information) 23. Respective parts of the configuration selection information 22 is also merged so as to select desired piece of CB mapping information 21 that includes pieces of composite CB mapping information 23. By doing so, the hardware control information 20 that includes the CB mapping information 21 and the configuration selection information 22 for configuring circuits to execute the application is generated.

It is also possible to merge pieces of the CB mapping information 21 at the stage relating of the RTL 33. In such case, pieces of the composite CB mapping information 23 are generated by carrying out logic synthesizing of merged RTL and place and routing. Such merging process attempts to make the scale of the circuits mapped by every pieces the CB mapping information 23 approximately equal, for example, at a scale that matches the units of the circuit blocks (rxe_plane) 51 described earlier. By doing so, it is possible to reduce the number of types of pieces of CB mapping information 21 that includes pieces of composite mapping information 23, included in the hardware control information 20 and to reduce the size of the hardware control information 20 required to execute the application.

In a typical process that merges some pieces of CB mapping information 21, there will be no combining of circuits to form a pipeline across several cycles in accordance with the signals transmitted between cycles and no insertion of input selectors to allow operating elements and registers to be used for multiple cycles. Conversely, a piece of CB mapping information 23 is generated so as to merge CB circuits that are in non-consecutive cycles but have common features present in the respective descriptions of RTL 33. Circuit configured by such piece of CB mapping includes wiring (routing) that is not required by the function in a given cycle but does not obstruct such function. Another type of merging is carried out to merge pairs of small-scale pieces of CB mapping information and thereby produce a piece of information of a size that is suited to the rxe_plane 51. Yet another type of merging allows the same operating elements and/or registers to be used over a plurality of cycles. Merging may also be carried out so that the same operating elements and/or registers are selected for different purposes by changing the wiring (routing) configuration itself in each cycle instead of using input selectors to switch between different circuits. If inputting into and/or outputting from a operating element or register has no effect on the function in a given cycle, information ("don't care") may be merged so as to ignore such inputting and outputting.

Figure 14:
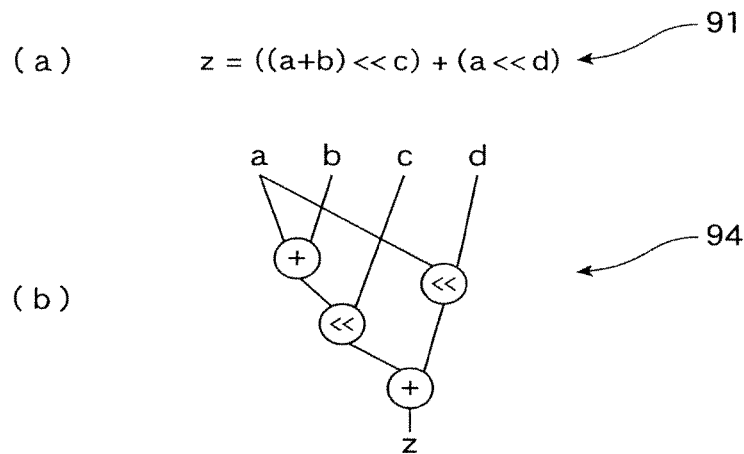
FIG. 14(a) shows one example of a C language specification.
FIG. 14(b) shows one example of a CDFG.
Figure 15:
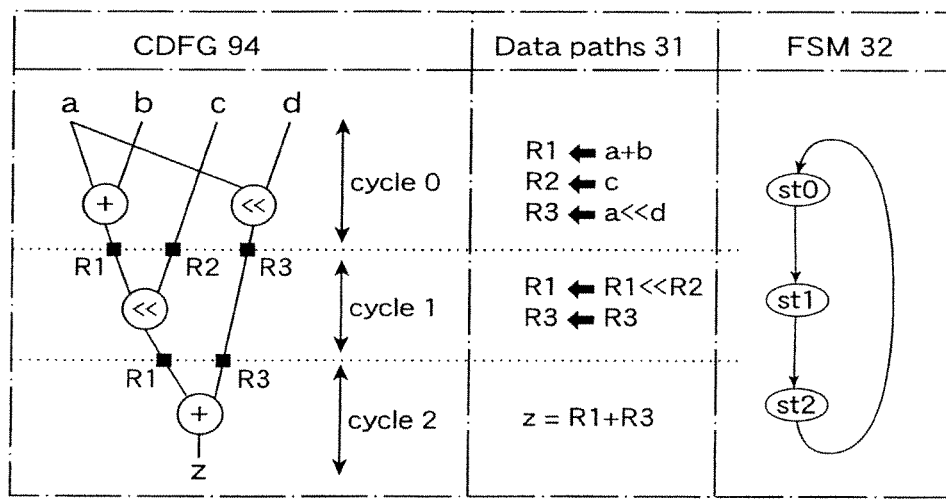
FIG. 15 shows a state where the functions in each cycle have been extracted.

The generation of the hardware control information will now be described using a simple specific example. FIG. 14(a) shows a simple specific example of the C source code 91. FIG. 14(b) shows the CDFG 94 after the C source code 91 has been parsed. FIG. 15 shows the result of extracting the functions in each cycle when the CDFG 94 has been scheduled according to a condition of "whether the delay time of operating elements exceed half a clock cycle". According to this scheduling, intermediate results are stored in the three registers R1 to R3 and operations are carried out for three cycles from cycle 0 to cycle 2. FIG. 15 shows the data paths 31 that provide the functions in each cycle and the control FSM 32, together with the CDFG 94.

FIG. 16(a) shows a circuit configuration 92c in which the data paths 31 in each cycle are expressed as a single integrated circuit that incorporates all of the functions in all of the cycles. In addition to the arithmetic/operating elements and registers for realizing the functions of the data paths, this circuit configuration 92c includes input selectors for such components and control signals (select signals) for such input selectors.

FIG. 16(b) shows a circuit configuration of the FSM 32. The circuit configuration 92c in FIG. 16(a) is a circuit generated typically for an ASIC or an FPGA, and to make repeated use of the operating elements and the registers, selectors 92s are additionally provided on the respective input sides of the operating elements 92a, 92b and the registers R1 and R3. Control signals for such selectors 92s are outputted from the FSM circuit 32 in FIG. 16(b).

Figures 16, 17:
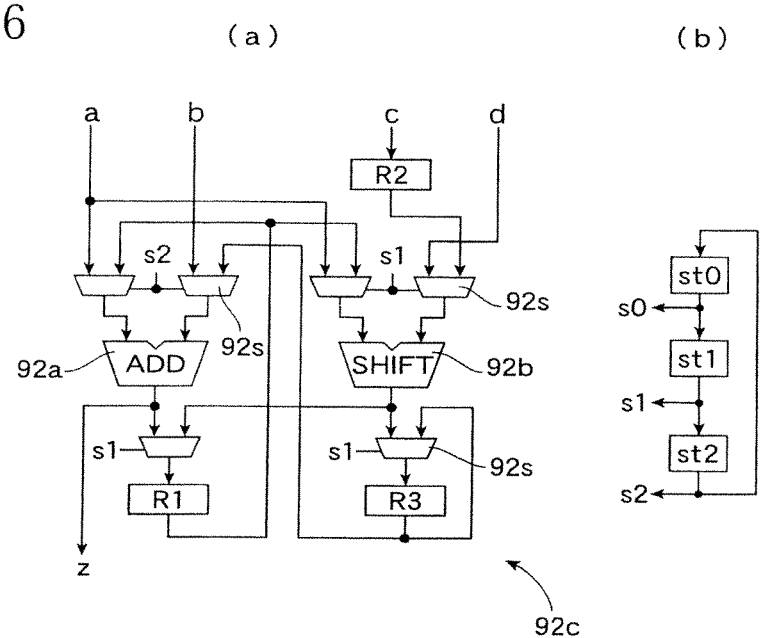
FIG. 17 shows an RTL description of the circuits shown in FIGS. 16A and 16B.
Figure 18:
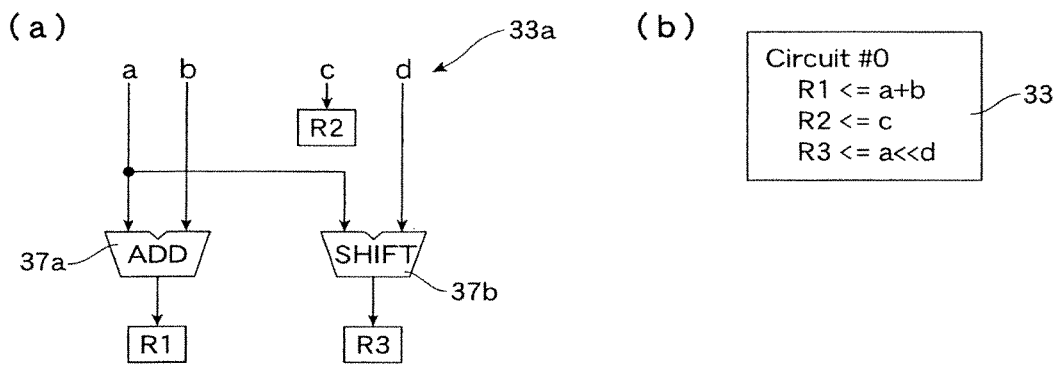
FIG. 18(a) shows a circuit in cycle 0 and FIG. 18(b) shows the RTL description thereof.
Figure 19:
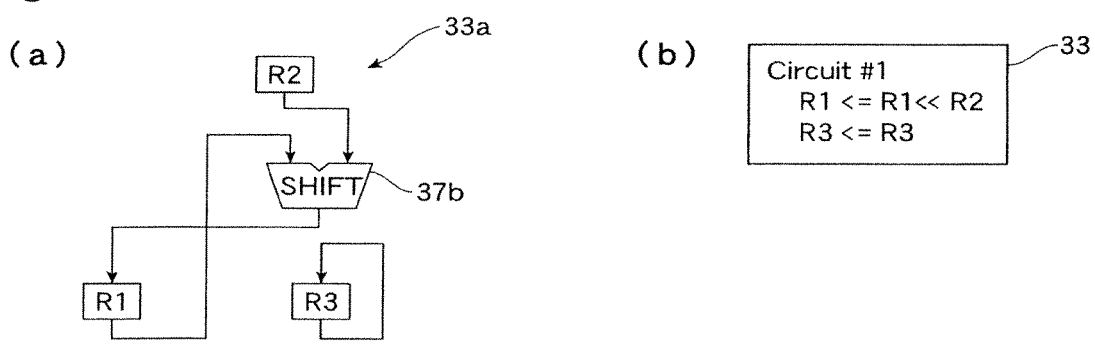
FIG. 19(a) shows a circuit in cycle 1 and FIG. 19(b) shows the RTL description thereof.
Figure 20:
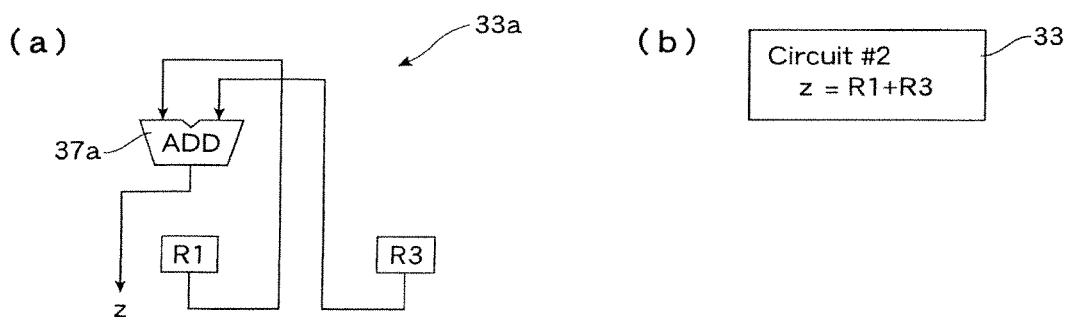
FIG. 20(a) shows a circuit in cycle 2 and FIG. 20(b) shows the RTL description thereof.

FIG. 17 shows an RTL description 92 corresponding to the circuit configuration 92c shown in FIG. 16(a). By generating the RTL description 92 corresponding to the circuit configuration 92c in FIG. 16(a) and processing the RTL description 92 with a logic synthesizing tool and a place and routing tool, the ASIC mask pattern or FPGA configuration information 96 is generated.

FIGS. 18 to 21 show the pieces of circuit information 33 for each cycle and the CB circuits 33a mapped by such pieces of circuit information 33. The circuit information 33 and the CB circuits 33a for each cycle are examples generated in step 73 of the generation method 79 corresponding to the input information in FIG. 14. FIG. 18(a) shows a CB circuit 33a corresponding to the data paths 31 in cycle 0 and FIG. 18(b) shows a piece of CB circuit information (that is shown as the RTL description) 33 for such CB circuit 33a. FIG. 19(a) shows the circuit configuration 33a corresponding to the data paths 31 in cycle 1 and FIG. 19(b) shows the RTL description 33 for such circuit configuration 33a. FIG. 20(a) shows the circuit configuration 33a corresponding to the data path 31 in cycle 2 and FIG. 20(b) shows the RTL description 33 for such circuit configuration 33a. In addition, FIG. 21 shows configuration selection information 34 produced by converting the information 32 that selects the functions in cycle units to information that selects a configuration in each cycle. The configuration selection information 34 is simple information that designates the CB circuits 33a that are to execute processing corresponding to state numbers.

The processing specified by the C source code 91 shown in FIG. 14(a) can be realized using the cycle-based functions 31 indicated by the data paths in FIG. 15 in respective cycles. Accordingly, by reconfiguring the cycle-based circuits 33a shown in FIGS. 18(a), 19(a), and 20(a) on the RC region 10 of the data processing apparatus 1, the processing can be executed. In step 74, pieces of information (CB mapping information) 21 for mapping onto the RC region 10 can be generated individually by using a logic synthesizing tool and a place and routing tool from the RTL descriptions 33 that correspond to the cycle-based circuits 33a and are shown in FIGS. 18(b), 19(b), and 20(b). In addition, by converting the information 34 that selects the configuration in cycle units to information 22 that controls the CB mapping information 21, it is possible to generate hardware control information 20 that includes the CB mapping information 21 and the information 22 that controls such CB mapping information 21.

The CB circuits 33a that are reconfigured in the RC region 10 of the data processing apparatus 1 by such pieces of CB mapping information 21 are corresponding to the circuits shown in FIGS. 18A, 19A, and 20A. In such CB circuits 33a, selectors are not disposed on the input sides of the operating (arithmetic/operating) elements 37a and 37b and the registers R1 and R3. Accordingly, compared to the circuit shown in FIG. 16, the configurations are simplified and the respective CB circuits can be realized even though the hardware scale of a RC region 10 is smaller or only part of a RC region 10 is used.

The CB circuit 33a of cycle 1 in FIG. 19(a) does not use the operating element 37a. The CB circuit 33a of cycle 2 in FIG. 20(a) does not use the operating element 37b or the register R2. On the other hand, the CB circuit 33a of cycle 0 in FIG. 18(a) uses the operating elements 37a and 37b in one cycle. Accordingly, to implement the functions of the C source code 91 provided in FIG. 14(a) with the timing (ability) in FIG. 15, it is necessary to reserve reconfigurable hardware of a sufficient scale in the RC region 10 to realize (reserve, keep or configure) both the operating elements 37a and 37b for a one-cycle period. Here, even if the CB circuits in cycles aside from cycle 0 are merged to a scale where both operating elements 37a and 37b are included, no area-related penalty will occur for the RC region 10. Accordingly, by merging the CB circuits 33a of cycles 1 and 2 to reduce amount of the CB mapping information 21, it is also possible to reduce the size or amount of the hardware control information 20.

Instead of merging the CB circuits 33a of different cycles, it is also possible to release operating element out of the operating elements 37a and 37b that is not used in respective cycles. In cycles where there is no request to use such operating element, there will be no drop in the processing speed of the CB circuit even if such operating element is released. Accordingly, in some cases, it is possible to generate hardware control information 20 for executing an application so as to use the operating elements released by the processing of other applications. By doing so, it becomes possible to execute a variety of applications in parallel without a drop in the execution speed of the applications.

Figure 22:
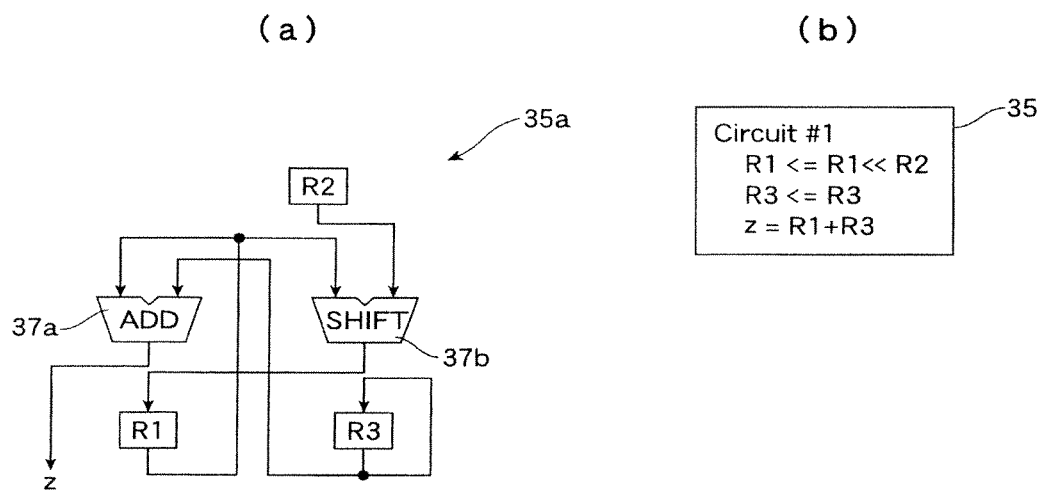
FIG. 22(a) shows a circuit produced by merging cycle 1 and cycle 2 and FIG. 22(b) shows the RTL description thereof.
Figure 23:
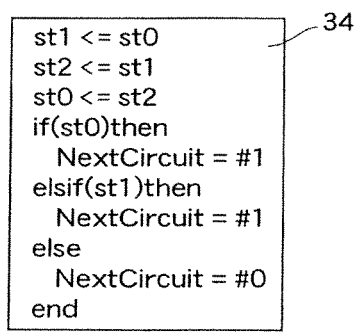
FIG. 23 shows selection configuration information.
Figure 24:
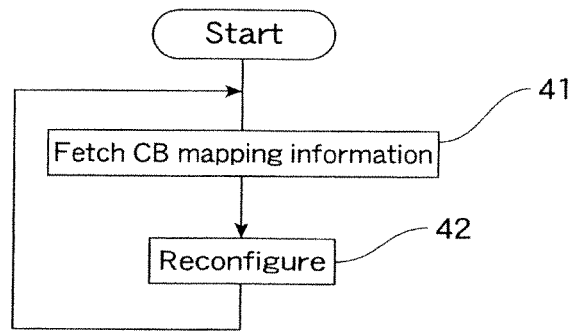
FIG. 24 schematically shows a method of controlling a data processing apparatus.

FIGS. 22 and 23 show examples where the pieces of cycle-based mapping information 21 described earlier are merged in step 75. Note that to simplify the explanation, FIGS. 23 and 24 show how the circuits of each cycle are merged by way of the CB circuits 33a and the pieces of information 33 corresponding to the CB circuits 33a. However, the hardware resources used to configure the circuits 33a in the RC region 10 in each cycle cannot be precisely determined without carrying out the process as far as logic synthesizing and place and routing. Accordingly, it is preferable to determine whether some pieces of CB mapping information 21 can be merged at the stage where such pieces of CB mapping information 21 have been generated. If it is necessary to reinvestigate the circuit configuration merged, the process of generating of the composite circuit returns to the RTL stage and merging is carried out. If sufficient hardware resources are available or if consumption of the hardware resources can be predicted, it is also possible to carry out merging at the stage of RTL descriptions that are corresponding to respective pieces of CB circuit information 33.

In the present example, the CB circuit 33a of cycle 1 shown in FIG. 19(a) and the CB circuit 33a of cycle 2 shown in FIG. 20(a) can be merged. FIG. 22(a) shows the configuration of a composite circuit produced by merging and FIG. 22(b) shows the RTL description 35 of such circuit. By merging in this way, the functions of cycle 1 and cycle 2 are implemented by maintaining the circuit 35a and executing for two cycles. The configuration selection information 34 is converted from FIG. 21 to FIG. 23. Note that the CB circuit 33a of cycle 0 and the RTL description thereof are the same as those in FIGS. 18A and 18B. As shown in FIG. 22(a), by merging the circuit of cycle 1 and the circuit of cycle 2 shown in FIGS. 19A and 20A, it is possible to generate a circuit for both cycles of a scale that is well balanced with the circuit of cycle 0 shown in FIG. 18(a). It is also possible to delete one page (piece) of the CB mapping information 21. Accordingly, it is possible to make effective use of the RC region 10, to reduce the size of the hardware control information 20, and to reduce the amount of the memory 3 used by the hardware library 2. Since it is also possible to reduce the number of times the configuration of the RC region 10 is switched, the electrical power consumed by switching the configuration can also be reduced.

In the merging process in step 75, the RTL description 33 of the CB circuit of cycle 0 and the RTL description 35 of the composite CB circuit produced by merging are individually processed by the logic synthesizing tool and the place and routing tool, then information (CB mapping information) 21 for mapping onto the RC region 10 that includes a piece of composite CB mapping information 23 are generated. The information 34 in FIG. 23 that selects the configurations in cycle units can also be converted into the information 22 that controls the CB mapping information 21. Also, from the pieces of CB mapping information 21 (and 23) and the configuration selection information 22 that controls the CB mapping information, the hardware control information 20 for controlling the RC region 10 in each cycle can be generated.

In the cycle-based circuits 33a and 35a that are mapped or reconfigured in the RC region 10 by the hardware control information 20 of the present example, input selectors for making various use of the operating elements 37a and 37b and the registers R1 to R3 across a number of cycles are not provided. However, when pieces of mapping information 21 are merged with the intention of reducing the number of types of pieces of mapping information 21, the provision of input selectors in the CB circuit 33a or the composite CB circuit 35a is not prohibited. That said, since extra hardware resources are consumed when input selectors are provided, such provision is fundamentally undesirable. To reduce the size of the CB mapping information 21, it is effective to merge pieces of CB circuits while minimizing the addition of selectors. If a selector or selectors are added when merging CB circuits, it is necessary to not only designate, via the configuration selection information, the circuit to carry out execution in the next cycle, but also to designate the select signal of each selector.

In the RC region 10 that can be reconfigured on a cycle basis, by switching between circuits in cycle units (in cycle basis) as shown by FIGS. 18A to 21A, it is possible to make various use of the operating elements 37a and 37b over a number of cycles without providing input selectors. In addition, variations of uses of operating elements are not limited by input selectors but are fundamentally infinite. An input selector can only select a signal among limited number of signals. The hardware control information 20 of the present invention makes it possible to make infinite different uses of the hardware resources of the RC region 10 in cycle basis.

In the composite CB circuit 35a shown in FIG. 22(a) that is mapped by the piece of composite CB mapping information 23, the circuit configuration is fixed for two cycles. In cycle 1 the signals in the periphery of the operating element 37a are ignored and in cycle 2 the signals in the periphery of the operating element 37b are ignored. Accordingly, by combining the "don't care" circuits of each cycle, it is possible to make various uses of the computing elements 37a and 37b across a plurality of cycles without providing input selectors. In the present example, the circuit configuration is fixed for two cycles, but another method is possible where a composite CB circuit 35a is configured in cycle 0, a CB circuit 33a is configured in cycle 1, and the composite CB circuit 35a is configured in cycle 2, with the fundamental premise being that the composite CB mapping information 23 can be used non-consecutively. Accordingly, a piece of composite CB mapping information 23 is for using a one-cycle part of a multi-cycle circuit configuration included in that piece of composite CB mapping information 23 in each cycle, and instead of providing an input selector, various use is made of hardware resources by switching between circuits in cycle basis in the same way as described above.

FIG. 24 schematically shows a method of controlling the data processing apparatus 1 that includes the RC region 10. As shown in FIG. 24, in step 41, one of the pieces of CB mapping information 21 is selected from the hardware control information 20 based on the configuration selection information 22. In step 42, all or part of the RC region 10 is reconfigured according to the selected piece of CB mapping information 21. By repeating these processes 41 and 42, a hardware suited to executing an application are provided on the data processing apparatus 1. When the number of cycles required to fetch and map the CB mapping information 21 does not match the number of cycles for which processing is carried out in the RC region 10, it is possible to use a conventional technique that fetches an instruction sequence of a software program, such as prefetching. Also, by generating a program in which instruction sequences of an application and series of pieces of CB mapping information 21 are combined by shifting certain latency or latencies, it is possible to provide control language for the data processing apparatus in which instruction sets of software and hardware control information are integrated. In this case, the instruction sets of the application include configuration selection information. This type of hardware control information 20 that may called integrated control language can be provided having been recorded on a suitable recording medium such as a ROM or may be provided via a computer network, such as the Internet, constructed using wires or wirelessly.

Figure 25:
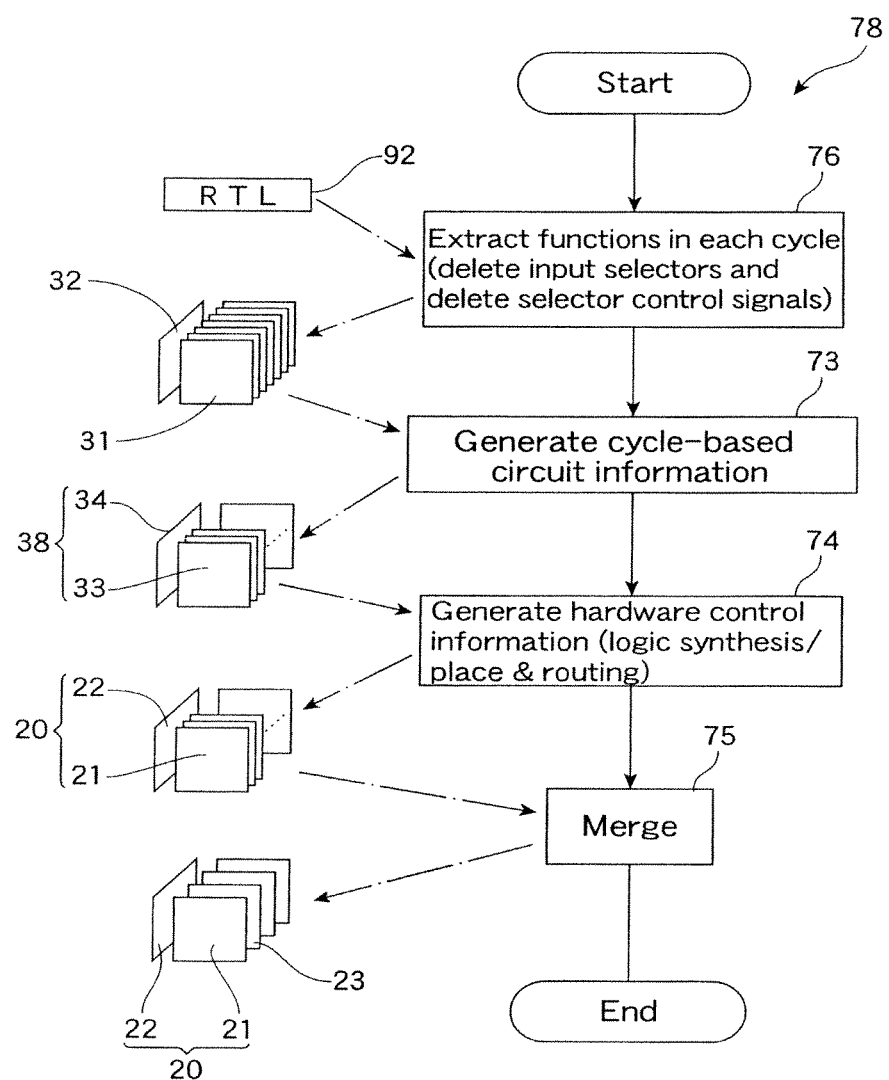
FIG. 25 is a flowchart showing a different method of generating the hardware control information.

FIG. 25 shows the procedure for generating the hardware control information 20 in the generation system 100 from an existing RTL description 92. The functional unit 101 of the generation system 100 includes a function of generating cycle-based circuit information (information on CB circuits) from the existing RTL 92. That is, in the method 78 of generating the hardware control information, in step 76, the description of state machine included in the existing RTL description 92 is analyzed and the data paths 31 in each state are resolved or divided. For example, input selectors are deleted and selector control signals are deleted. By doing so, the function in each cycle is extracted. Then, in the same way as the method 79 shown in FIG. 13, RTL description (piece of CB circuit information) 33 is generated for each cycle by the process of step 73 of generating the cycle-based circuit information, and the CB mapping information 21 is generated by the process of step 74 of generating the hardware control information. If necessary, in step 75, parts of the CB mapping information 21 that can be merged are merged to generate the hardware control information 20. According to this generation method 78, it is possible to make effective use of existing RTL resources that have been designed and developed for an FPGA or an ASIC. It is also possible to generate the hardware control information 20 so as to be capable of running software that runs on an FPGA or ASIC with a configuration based on existing RTL, and to reconfigure the data processing apparatus 1 using such hardware control information 20. This means that it is possible to have an application that operates on an existing FPGA or ASIC executed by the data processing apparatus 1.

Figure 26:
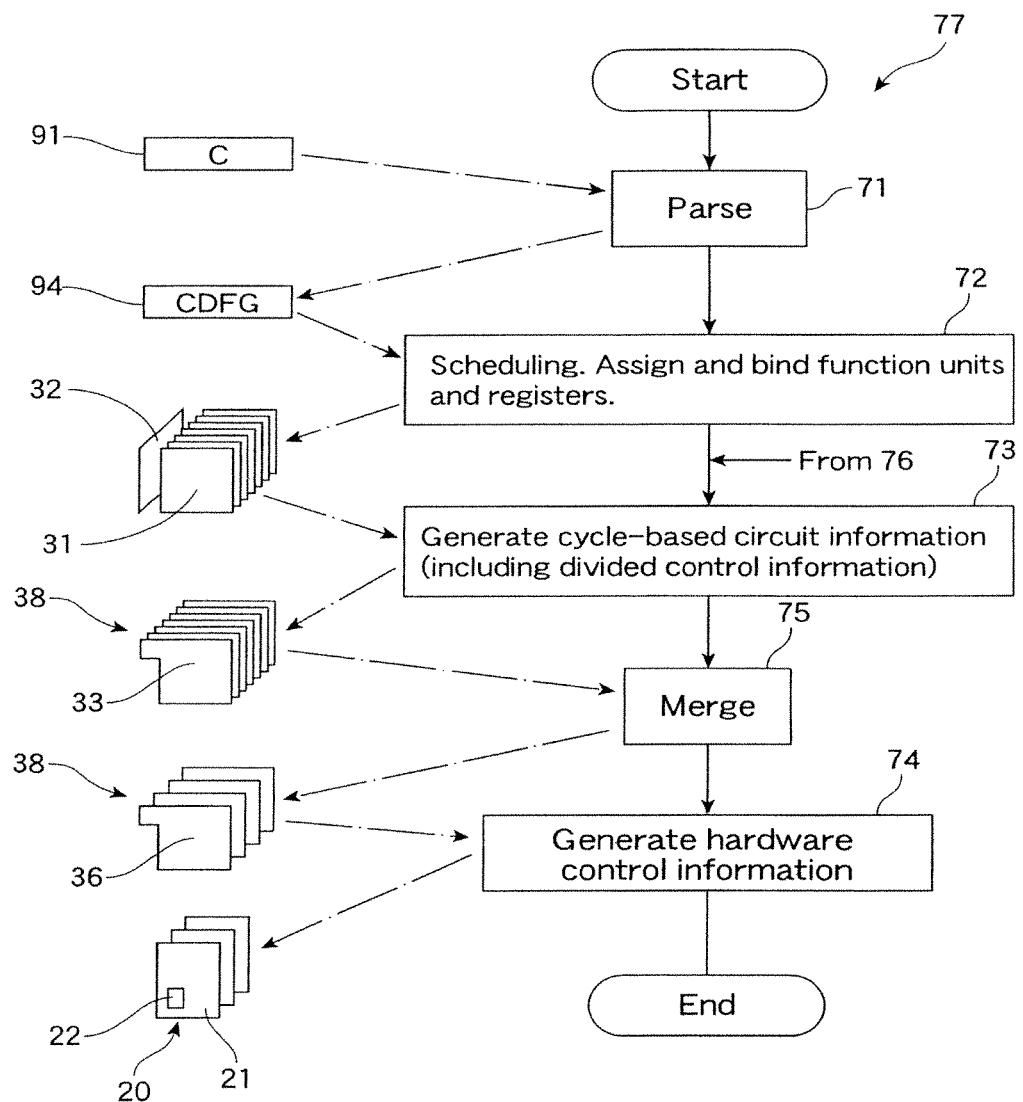
FIG. 26 is a flowchart showing yet another method of generating the hardware control information.

FIG. 26 shows a method of generating "divided control"-type hardware control information 20 in the generation system 100. In the divided control-type hardware control information 20 generated by this generation method 77, pieces of configuration selection information 22 are included in the respective pieces of CB mapping information 21 and configuration selection information for controlling overall CB mapping information is not included. After the data paths 31 and the control state machine 32 for each cycle have been generated by step 76 of the generation method 78 or step 72 of the generation method 79 described earlier, the RTL description 33 in each cycle is generated in step 73. In this method 77, in the step 73, a function of control state machine, that is, a function that calculates the following state for each state is divided into the circuits for each state (i.e., for each cycle) and such circuits are added to the data path circuits of each cycle.

Figure 27:
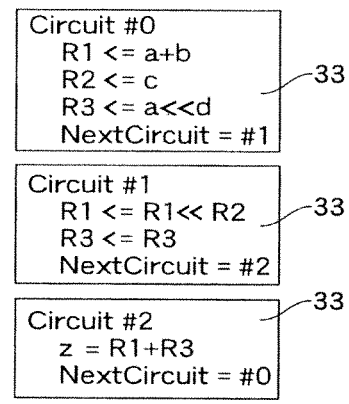
FIG. 27 shows a different example of the RTL description generated in each cycle.

As shown in FIG. 27, pieces of circuit information 38 of cycle-based circuits that respectively include functions that calculate selection information, such as a number, of a circuit to carry out execution in the next cycle are generated as descriptions of RTL 33 of respective cycles. Although the number of the circuit to carry out execution in the next cycle is designated by immediate or constant value in the present example, by providing the RTL 33 with a function that variably designates a circuit number of the next cycle, it is possible to append each piece of CB mapping information 21 with a function that selects, according to a suitably calculated value or status information, the piece of CB mapping information 21 to be mapped in the next cycle.

Figure 28:
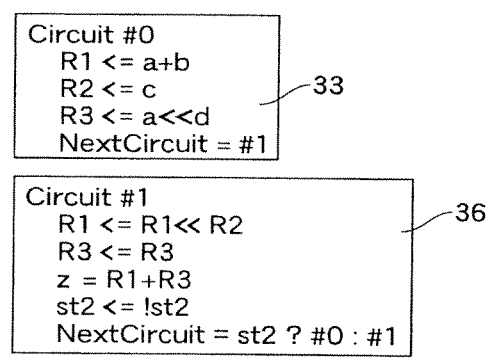
FIG. 28 shows an example where the RTL descriptions have been merged.

By carrying out step 74, it is possible to generate hardware control information 20 that includes pieces of CB mapping information 21 generated from the pieces of information 33 of the CB circuits that include the function for calculating the configuration selection information 22. In the generation method 77 shown in FIG. 26, the merging step 75 is carried out first to attempt to merge the descriptions of RTL 33 of cycle basis and the descriptions of composite RTL 36 of cycle basis are generated. The composite descriptions of RTL 36 in cycle basis are pieces of circuit information 38 for cycle-based circuits that includes selection information. In the present example, as shown in FIG. 28, the descriptions RTL 33 of cycle 1 and cycle 2 can be merged or combined (including the control information) to produce the composite RTL 36. Logic synthesizing and place and routing are carried out for the descriptions of RTL 33 and 36 by step 74 (which generates the hardware control information) to generate pieces of CB mapping information 21 (including composite CB mapping information respectively) that can be mapped onto the RC region 10. Such pieces of CB mapping information 21 include circuits that generate the control information 22 for selecting the next piece of CB mapping information 21 to be mapped in the next cycle as described earlier.

The hardware control information 20 provided in the present invention is used to implement circuits for executing an application on a cycle basis in hardware that can be reconfigured on a cycle basis. In addition, instead of being a design method with a premise of "long-period operation" where the circuit configuration may be changed at the functional module level, the premise is to change the circuit configuration at the operation state level, that is, changing the circuit configuration in each state (i.e., in each cycle), or to switch the circuit configuration in each cycle. Accordingly, in a developing stage or in a designing stage, instead of a process that examines the functional modules to be reconfigured, a process that generates cycle-based circuit information in advance and generates the CB mapping information to implement the cycle-based circuit information in the actual architecture is used. The reconfigurable circuit region executes the application while being controlled in a state where the configuration is fundamentally switched in each cycle and there is no fixed configuration.

On the other hand, the hardware control information 20 is permitted to include a piece or pieces of mapping information that are fixed in the reconfigurable circuit region for several cycles. As a hardware configuration that executes an application including data processing such as vector calculations and Fourier analysis for which pipeline processing is most preferable, the hardware that constructs a pipeline or pipelines should preferably be fixed for several clocks or more. As a hardware configuration that executes an application, such as an MPEG decoder, where state machine type processing is required, it is preferable to change the circuit configuration in each cycle. When a processor that requires to include both (i) a control processor part for a state machine such as a RISC and (ii) a coprocessor functional part for pipeline processing such as an FFT, is implemented in the data processing apparatus 1, configuration of part of the RC region 10 is varied in each cycle but the other part of the RC region 10 may be fixed for several cycles or more in a state where a data flow is formed. Such selection about whether to reconfigure is determined according to requests in the configuration selection information 22 in each cycle, and if reconfiguring is not requested, the configuration of the RC region 10 is maintained. Accordingly, this invention includes, with the CB mapping information 21 of the hardware control information 20, controlling by the configuration selection information 22 to reconfigure the RC region according to requests in each cycle and to maintain the configuration of the RC region 10.

Also, although an example where the present invention is applied to LSIs based on semiconductor integrated circuit technology has been described above, it is also possible to apply the present invention to all data processing apparatuses or system that includes forming of a so-called "circuit network". That is, the present invention is not limited to a data processing apparatus that is based on electric or electronic circuit technology and the present invention can also be applied to all data processing apparatuses that include forming of a circuit network based on an optical, biological, molecular, or atomic structure, a genetic structure, or the like.

The invention claimed is:

1. A data processing apparatus comprising:
a logic circuit that is reconfigurable in each cycle; and
a library in which hardware control information is stored, wherein the hardware control information includes:
a plurality of pieces of cycle-based mapping information for mapping a plurality of cycle-based circuits onto the logic circuit individually, each of the plurality of cycle-based circuits realizing a function in each cycle for executing an application; and
configuration selection information for selecting at least one of the plurality of pieces of cycle-based mapping information according to an execution state of the application, and
the data processing apparatus further comprises:
a control unit that reconfigures, according to a request in each cycle based on the configuration selection information, at least part of the logic circuit using at least one of the plurality of pieces of cycle-based mapping information.

2. The data processing apparatus according to claim 1, wherein the plurality of pieces of cycle-based mapping information include a piece of composite cycle-based mapping information produced by merging pieces of cycle-based mapping information that are capable of being merged without obstructing functions in each cycle.

3. The data processing apparatus according to claim 1, wherein each of the plurality of pieces of cycle-based mapping information includes information for mapping a control unit for each cycle onto the logic circuit, and the control unit for each cycle is reconfigured in the logic circuit.

4. A non-transitory, computer-readable medium storing instructions for controlling a data processing apparatus, the data processing apparatus including a logic circuit that is reconfigurable in each cycle, a library in which hardware control information is stored, and a control unit that reconfigures at least part of the logic circuit, wherein the instructions, when executed by one or more processors of a computer system, cause the one or more processors to: reconfigure the at least part of the logic circuit based on the hardware control information stored in the library, wherein the hardware control information includes:
a plurality of pieces of cycle-based mapping information for mapping a plurality of cycle-based circuits onto the logic circuit individually, each of the plurality of cycle-based circuits realizing a function in each cycle for executing an application; and
configuration selection information for selecting at least one of the plurality of pieces of cycle-based mapping information according to an execution state of the application, and
select at least one of the plurality of pieces of cycle-based mapping information according to a request in each cycle based on the configuration selection information and reconfigure the at least part of the logic circuit using the selected at least one of the plurality of pieces of cycle-based mapping information.

5. The non-transitory, computer-readable medium of claim 4, wherein each of the plurality of pieces of cycle-based mapping information includes information for mapping a control unit for each cycle onto the logic circuit, and wherein the instructions cause the one or more processors to reconfigure the at least part of the logic circuit by at least reconfiguring the at least part of the logic circuit according to a request of the control unit for each cycle that has been reconfigured in the logic circuit.

* * * * *